United States Patent [19]

Asai

[11] Patent Number: 5,609,694
[45] Date of Patent: Mar. 11, 1997

[54] SOLAR CELL AND A METHOD OF MANUFACTURING THEREOF

[75] Inventor: Masahito Asai, Nara, Japan

[73] Assignee: Sharp Kabushiki Kaisha, Osaka, Japan

[21] Appl. No.: 428,869

[22] Filed: Apr. 25, 1995

[30] Foreign Application Priority Data

Apr. 28, 1994 [JP] Japan .................................. 6-091443

[51] Int. Cl.$^6$ .............................. H01L 31/06; H01L 31/18
[52] U.S. Cl. .......................... 136/255; 136/244; 136/256; 136/261; 257/463; 257/465; 437/2
[58] Field of Search ..................................... 136/244, 255, 136/256, 261; 257/463, 465; 437/2–5

[56] References Cited

FOREIGN PATENT DOCUMENTS

| | | | |
|---|---|---|---|
| 56-60075 | 5/1981 | Japan . | |
| 58-101471 | 6/1983 | Japan | 136/255 |
| 59-27579 | 2/1984 | Japan | 136/256 |
| 59-94883 | 5/1984 | Japan . | |
| 2-33980 | 2/1990 | Japan . | |
| 3-24768 | 2/1991 | Japan . | |
| 3-62031 | 9/1991 | Japan . | |
| 4-42974 | 2/1992 | Japan . | |
| 5-75148 | 3/1993 | Japan | 136/256 |
| 5-110121 | 4/1993 | Japan . | |

*Primary Examiner*—Aaron Weisstuch

[57] ABSTRACT

A solar cell includes a first n$^+$ type layer formed on the upper surface of a p type silicon substrate, a p type layer formed on the back surface of the substrate and having a dopant impurity concentration higher than that of the substrate, and a second n type layer formed at least on the edge face of the substrate so as to connect the first n type layer and the p type layer. The second n type layer has an impurity concentration lower than that of the first n$^+$ layer proximate the region in contact with the p type layer.

8 Claims, 25 Drawing Sheets

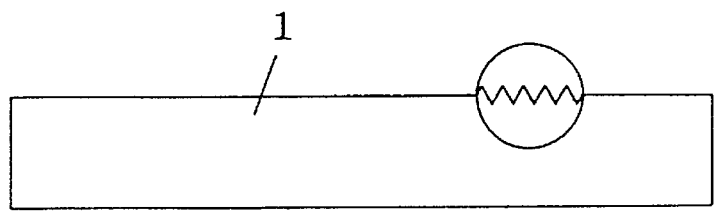
F I G. 9(A)
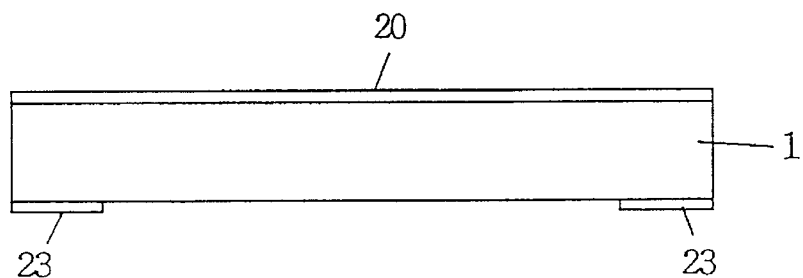
F I G. 9(B)
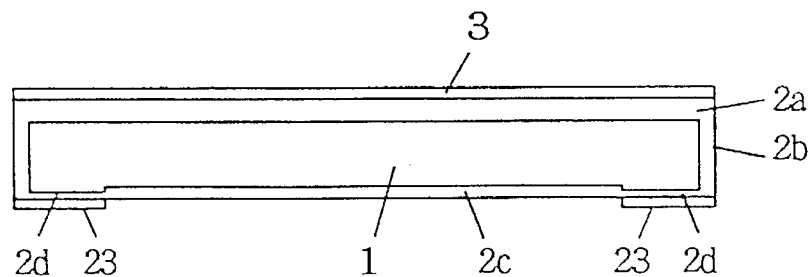
F I G. 9(C)

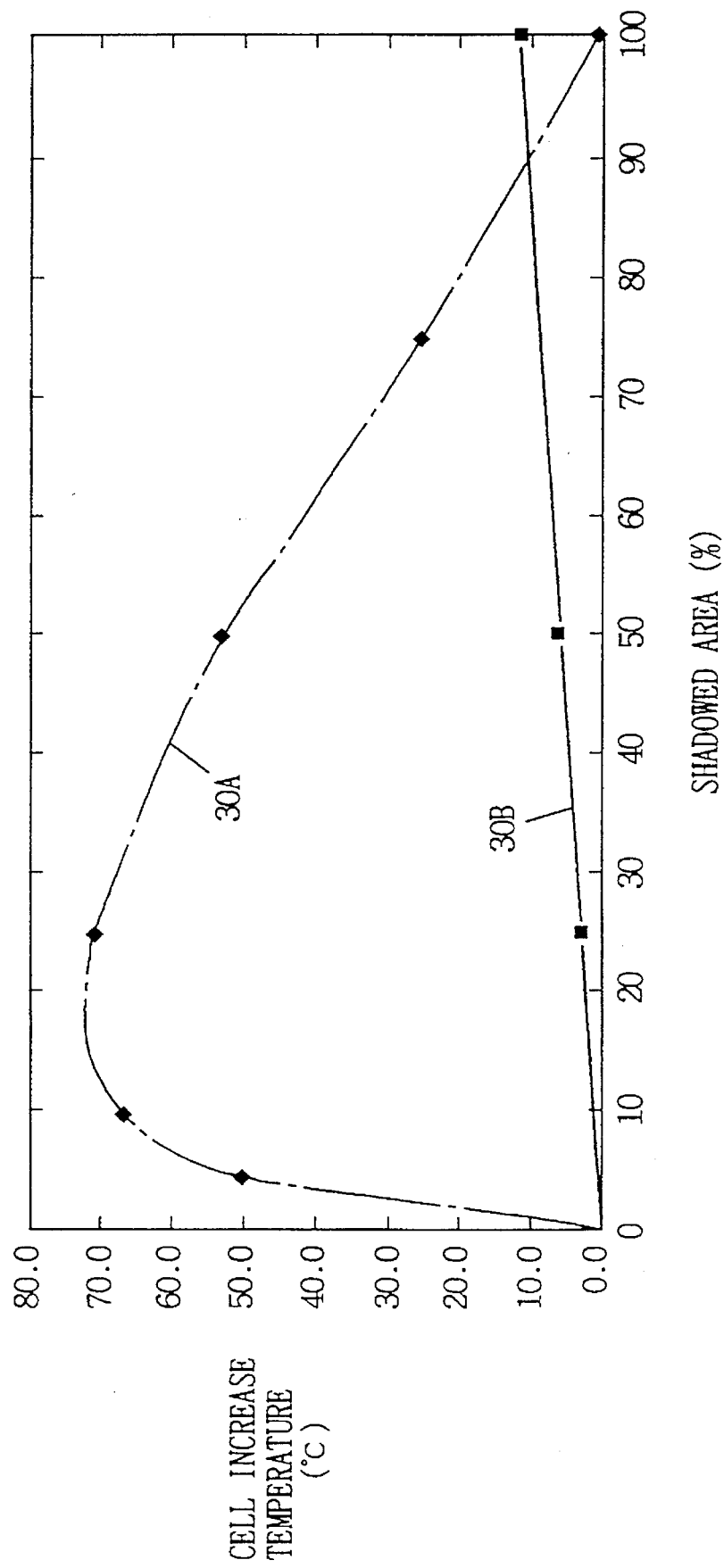

SOLAR CELL AND A METHOD OF MANUFACTURING THEREOF

BACKGROUND OF THE INVENTION

1. Field of the Invention

The present invention relates to a solar cell and a method of manufacturing the same, and more particularly, to improvement of a solar cell used in a solar cell module including a plurality of series-connected solar cells and a method of manufacturing the same.

2. Description of the Background Art

FIGS. 19 and 20 show a light receiving surface (also referred to as "front plane") and a back surface of a conventional solar cell. A solar cell 10 includes a semiconductor substrate 1. The front plane of substrate 1 is covered with an anti-reflection film 3. A comb-like front silver electrode is formed on anti-reflection film 3. The front silver electrode is covered with a solder layer 8a. A major portion of the back surface of solar cell 10 is covered with an aluminum electrode 6. Back silver electrodes are formed at a plurality of local regions in the region of the aluminum electrode 6. The back silver electrodes are covered with a solder layer 5a.

FIGS. 21 and 22 illustrate a method of manufacturing the solar cell shown in FIGS. 19 and 20. For the sake of simplification, the dimensions between various elements shown in the drawings are not drawn to scale.

It is to be noted that FIGS. 21(A) to (D) and FIG. 22(A) to (D) show sequential steps of one manufacturing process.

Referring first to FIG. 21(A), a semiconductor substrate 1 is prepared having, for example, a diameter of 100 mm, and a thickness of 0.4 mm. A P-type semiconductor substrate 1 generally has an impurity concentration in the range of $3 \times 10^{15}$ to $4 \times 10^{16}$ cm$^{-3}$. A silicon substrate 1 having a (100) main surface is generally used. Preferably, the light receiving surface of the silicon substrate 1 is formed in a pyramid-like concave and convex manner (referred to as a "textured surface") as in the circle showing an enlarged portion thereof, for the purpose of reducing light reflection. Such a textured surface is formed by treating the silicon substrate 1 for 20 to 30 minutes at a temperature in the range of 80° C. to 90° C. while adding isopropyl alcohol in a solution including several % of NaOH.

Referring next to FIG. 21(B), an n$^+$ layer 2 having a thickness of approximately 0.4 μm, for example, is formed all over the surface of the silicon substrate 1. An n$^+$ layer 2 can be formed by applying a diffusion process for 45 minutes at 900° C. in an ambient including POCl$_3$ gas, for example. Here, a phosphorus glass film (not shown) is produced on the surface of n$^+$ layer 2 which is not required. This phosphorus glass film can be removed by dipping the same in a solution including 10% of HF for one minute.

Referring to FIG. 21(C), an anti-reflection film 3 such as titanium oxide or silicon oxide is formed by evaporation or CVD on the light receiving surface of the substrate 1. An anti-reflection film 3 is formed to a thickness of 70 to 80 nm. The presence of an n$^+$ layer 2 all over the surface of silicon substrate 1 causes shorting between the negative voltage (n side) and the positive electrode (p side) of the solar cell, so that favorable electrical characteristics cannot be obtained. It is therefore necessary to the n$^+$ layer 2 at least from the back surface of silicon substrate 1.

Referring to FIG. 21(D), an acid resistant resist 4 is applied on the anti-reflection film 3 by screen printing and then dried. Then, an etching step is applied using a mixture of hydrofluoric acid and nitric acid (HF: HNO$_3$=1:3), whereby the n$^+$ layer 2 is removed from the side face and back surface of the substrate 1.

Then, the resist layer 4 is removed using a solvent such as toluene or xylene as shown in FIG. 22(A). Referring to FIG. 22(B), paste 5 including silver and paste 6 including aluminum are printed at a predetermined pattern and then dried. The substrate 1 is subjected to a thermal treatment at 700° C. to 800° C. whereby a back silver electrode 5 having a thickness of approximately 20 μm and a back aluminum electrode 6 having a thickness of approximately 50 μm are formed by baking. Here, aluminum and silicon are alloyed, whereby a p$^+$ layer 7 is formed under the aluminum electrode 6. The p$^+$ layer 7 has a thickness of approximately 5 μm to induce a BSF (Back Surface Field) effect.

Referring to FIG. 22(C), a paste 8 including silver is printed at a predetermined pattern on the anti-reflection film 3 and then dried. Then, a thermal treatment is applied to the substrate 1 at a temperature in the range of 600° C.–700° C., whereby a front silver electrode 8 having a thickness of approximately 20 μm is formed by baking. Here, the silver paste includes glass frit, and the front silver electrode 8 forms an ohmic contact with the n$^+$ layer 2 through the anti-reflection layer 3.

Referring to FIG. 22(D), solder layers 5a and 8a having a thickness of approximately 20 μm are formed on the surfaces of the back silver electrode 5 and front silver electrode 8, respectively. Thus, a solar cell 10 is completed. The structure shown in FIG. 22(D) corresponds to the structure of FIG. 20 taken along line 24H—24H.

Although the above description is made of an n$^+$ layer 2 formed by diffusion using POCl$_3$ gas, an n$^+$ layer can be formed on a light receiving surface by applying a dopant solution including alkyl silicate, alcohol, carboxylic acid, etc. and phosphorus pentoxide as a diffusion source on the light receiving surface of the silicon substrate by a spin coater, which is then subjected to a diffusion thermal treatment. However, this known method also results in formation of an n layer at the back surface and side face of the silicon substrate due to auto doping caused by out-diffusion from the applied doping agent. Therefore, this n layer must be removed as in the step shown in FIG. 21(D) by a resist printing method.

The above-described conventional method of manufacturing a solar cell requires various steps such as a resist printing method to remove unrequired regions of the n type layer, an etching step, and a resist removal step. Therefore, the conventional manufacturing process of a solar cell is expensive.

Furthermore, a conventional solar cell manufactured as described above has problems as set forth in the following.

A solar cell is seldom used singly, and a solar cell module is generally used in which a plurality of solar cells are connected in series, as shown in FIG. 23(A).

FIG. 23(A) shows the top plan view of a solar cell module including thirty six solar cells 10 connected in series. A solar cell 10 is connected to an adjacent solar cell 10 in series by an interconnector 11.

FIG. 23(B) shows a cross section structure of the solar cell module of FIG. 23(A) taken along line 23B—23B. The solar cell module includes a support plate 12 of transparent tempered glass. The solar cells 10 connected in series by interconnectors 11 are imbedded within an EVA resin layer 13. A white weather resistant film 14 covers the bottom surface of the EVA resin layer 13.

FIG. 23(C) is an equivalent circuit diagram of a solar cell module having a plurality of solar cells connected in series.

In FIG. 23(C), the small arrows represent light entering a solar cell, and the long arrow I represents the direction of the output current of the solar cell module.

When a solar cell module is actually used, a portion thereof may be shadowed. More specifically, the shadow of a tree, a building, or electric wires is cast on the solar cell module. There is also a possibility of the solar cell module being shadowed by droppings of birds or dust adhered to the surface thereof.

In a mode where a short-circuit is established across solar cells at both ends of the solar cell module, voltage generated from a solar cell which is not shadowed is applied to a solar cell which is shadowed as a reverse bias voltage. In such a shadowed solar cell, power caused by current according to the reverse bias voltage generates heat to be consumed. When this reverse bias voltage exceeds the peak inverse voltage of the solar cell, short-circuit breakdown occurs in that solar cell, whereby the output characteristics of the entire solar cell module are significantly degraded. The rise in temperature and the short-circuit breakdown of a shadowed solar cell depends upon the reverse direction properties of a solar cell. It is preferable to facilitate current flow in the reverse direction of a solar cell in order to reduce such a phenomenon.

In a conventional solar cell as shown in FIG. 22(D), complete isolation is achieved by a pn junction between the positive electrode side and the negative electrode side. Therefore, the forward direction properties of the solar cell are favorable so that a high conversion efficiency can be obtained. However, current does not easily flow in the reverse direction.

FIG. 24 shows the current voltage (I-V) characteristics of such a solar cell in a qualitative manner. The voltage V is plotted along the abscissa, and the current I is plotted along the ordinate. Curve 24A shows the I-V characteristics of a solar cell illuminated with light, and curve 24B shows the same in a solar cell in a darkened state. It is appreciated that reverse direction current cannot easily flow in a solar cell as shown in FIG. 22(A) in a darkened state.

FIG. 25 shows an equivalent circuit diagram of a solar cell. It is considered that a solar cell includes parallel resistance and serial resistance. More specifically, it is expected that a solar cell having the I-V characteristics as shown in FIG. 24 has great parallel resistance. It is to be noted that the parallel resistance and serial resistance are not shown in the equivalent circuit diagram of FIG. 23(C).

FIG. 26 is a graph showing the influence of a shadow in a solar cell module including thirty six solar cells, each having a diameter of 100 mm, and a parallel resistance of 20 k$\Omega$/cm$^2$. The output voltage of the solar cell module is plotted along the abscissa, and the output current is plotted along the ordinate. The curve representing 100% shows the I-V characteristics of a solar cell module in which the light receiving surface of one solar cell is entirely shadowed out of the thirty six solar cells. Similarly, the various % numerics corresponding to respective curves represent the amount of the shadowed area formed on one solar cell out of the thirty six solar cells. It is appreciated from FIG. 26 that the entire output of a solar cell module is extremely reduced as the area of a shadow formed on one solar cell increases when each solar cell has great parallel resistance.

FIGS. 27(A) and (B) show the result of a simulation in assessing the power consumption of one shadowed solar cell in a solar cell module where thirty two solar cells having a parallel resistance of 20 k$\Omega$/cm$^2$ are connected in series. In FIG. 27, the curve 27B shows the I-V characteristics of one solar cell in which 20% of the light receiving area is shadowed. Curve 27A shows the I-V characteristics of the remaining thirty one solar cells connected in series. Curve 27C shows the I-V characteristics obtained by combining curves 27A and 27B. The area of the hatched region corresponds to power consumed by the one shadowed solar cell.

Referring to FIG. 27(B), curve 27D shows the I-V characteristics of one solar cell in which 70% of the light receiving area is shadowed. Curve 27(E) shows the I-V characteristics obtained by combining curves 27A and 27D. By comparing the area of the hatched region between FIG. 27(A) and FIG. 27(B), it is appreciated that the power expended by a shadowed solar cell having a shadowed light receiving area of 70% is lower than that having a shadowed light receiving area of 20%.

FIGS. 28(A) and (B) are similar to FIGS. 27(A) and (B), but wherein each solar cell has a parallel resistance of 1 k$\Omega$/cm$^2$. Referring to FIG. 28(A), curve 28B shows the I-V characteristics of one solar cell in which 20% of the light receiving area is shadowed. Curve 28A shows the I-V characteristics of the remaining thirty one solar cells. Curve 28C shows the I-V characteristics obtained by combining curves 28A and 28B. Referring to FIG. 28(B), curve 28D shows the I-V characteristics of one solar cell in which 70% of the light receiving area is shadowed. Curve 28E shows the I-V characteristics obtained by combining curves 28A and 28D. It is appreciated by comparing the area of the hatched regions between FIG. 28(A) and FIG. 28(B) that power expended by one shadowed solar cell having a shadowed light receiving area of 70% is greater than that having a light receiving area of 20%, contrary to FIGS. 27(A) and (B).

FIG. 29 is a graph showing a result of a wider range of such a simulation shown in FIGS. 27(A), (B) and FIGS. 28(A), (B). In the present graph, the ratio of a shadow formed on the light receiving surface of one solar cell is plotted along the abscissa, and a power (W) expended by one shadowed solar cell is plotted along the ordinate. Curves 29A, 29B, and 29C correspond to a solar cell having parallel resistance of 20 k$\Omega$/cm$^2$, 1 k$\Omega$/cm$^2$, and 100 k$\Omega$/cm$^2$, respectively. It is appreciated that the increase in temperature of a shadowed solar cell is greater as the power consumption is increased.

FIG. 30 is a graph showing the increase in temperature of one shadowed solar cell in a module having thirty six solar cells connected in series. The ratio of shadowed area to the light receiving surface is plotted along the abscissa, and the increase in temperature (° C.) of a shadowed solar cell is plotted along the ordinate. Curve 30A shows the increase in temperature when the solar cell has a parallel resistance of 20 k$\Omega$/cm$^2$. It is appreciated from curve 30A that the temperature of a shadowed solar cell is higher by 72° C. than other solar cells when 20% of the light receiving area is shadowed in the shadowed solar cell. (Curve 303 will be explained later).

FIG. 30 relates to a solar cell module including thirty six solar cells connected in series. The increase in temperature of a shadowed solar cell will be further increased in a solar cell module including a greater number of solar cells. In practice, there is sufficient possibility of 20% of the light receiving area of one solar cell being shadowed.

Thus, it is understood that local shadowing in a solar cell module causes significant reduction in the output of the entire module. There is possibility of a shadowed solar cell being heated excessively so as to be damaged. In the worst case, a fire may break out. For example, in fine weather, the entire solar cell module rises to the temperature of 60° C. to 70° C. by solar heat. According to the example shown in FIG. 30, a solar cell having 20% of the light receiving area shadowed may be heated up to 132° C. to 142° C. In such a case, there is possibility of the EVA resin in which solar cells are imbedded being colored or pores being generated therein.

In order to prevent damage due to heating of such a shadowed solar cell, a solar cell module as shown in FIGS. 31(A), (B) and (C) has been proposed. The solar cell module of FIG. 31(A) has rectangular solar cells 10 connected in series by interconnectors 11. FIG. 31(B) is an enlarged perspective view of the portion indicated by the circle in FIG. 31(A). More specifically, adjacent solar cells 10 are connected by an interconnector 11 via a bypass diode 15. FIG. 31(C) is an equivalent circuit diagram of a solar cell 10 including the bypass diode 15 of FIG. 31(B) (parallel resistance and serial resistance are not shown). It is appreciated from the circuit diagram that the bypass diode 15 passes current caused by reverse bias voltage applied to a shadowed solar cell 10. Therefore, excessive heating or a short circuit breakdown can be prevented in a shadowed solar cell. However, the solar cell module of FIGS. 31(A), (B), and has the disadvantage that the process of connecting the plurality of solar cells while attaching a bias diode is very complicated. Therefore, the manufacturing cost thereof is expensive.

The usage of solar cells having integrated bypass diodes (Japanese Patent Laying-Open No. 3-24768) and solar cells integrated with zener diodes connected in parallel with the same polarity (Japanese Patent Laying-Open No. 5-110121) are known for solar cell modules. However, such solar cells must have diodes formed therein using mask alignment, which is a complicated manufacturing process of the solar cell. This results in an increase of the manufacturing cost.

SUMMARY OF THE INVENTION

In view of the foregoing, an object of the present invention is to provide a solar cell that can have significant reduction of the output of the entire module prevented when a solar cell is partially shadowed in a solar cell module.

Another object of the present invention is to provide a solar cell module improved so as to prevent excessive heating and short circuit breakdown caused by reverse bias voltage when a solar cell module is partially shadowed.

A further object of the present invention is to provide such an improved solar cell at a low cost using simple manufacturing steps.

A solar cell according to an aspect of the present invention includes: a p type semiconductor substrate having a first main surface, a second main surface, and an edge face therebetween; a first n type layer formed on the first main surface; a p type layer formed on the second main surface and having an impurity concentration higher than that of the substrate; and a second n type layer formed at least on the edge face so as to connect the first n type layer and the p type layer. The second n type layer has a dopant impurity concentration lower than that of the first n type layer at least in the vicinity of the region in contact with the p type layer.

A method of manufacturing a solar cell according to another aspect of the present invention includes the steps of: preparing a p type semiconductor substrate having a first main surface, a second main surface, and an edge face therebetween; applying an n type dopant agent on the first main surface; forming an $n^+$ type layer on the first main surface and an n type layer on the second main surface by applying a first thermal treatment to the substrate applied with a doping agent; applying a paste layer including aluminum on the second main layer; and forming a $p^+$ type layer on the second main layer and an electrode by applying a second thermal treatment to the substrate having the paste layer including aluminum applied.

In the solar cell of the present invention, the connection region of the second n type layer and the p type layer form a small diode connected in parallel with a polarity identical to that of the solar cell formed of the p type substrate and the first n type layer. When the small diode is illuminated with light, a weak electromotive force of a polarity identical to that of the solar cell is generated. When a reverse bias voltage is applied to that solar cell, the small diode can pass through a current caused by the reverse bias voltage as leakage current since it has inferior reverse direction properties. More specifically, the solar cell of the present invention is characterized by including low parallel resistance when a reverse bias voltage is applied. Therefore, the usage of a solar cell of the present invention in a solar cell module prevents significant reduction in the output of the entire module even when the solar cell module is shadowed locally. Excessive heating and short circuit breakdown are avoided in a shadowed solar cell.

The manufacturing method of a solar cell according to the present invention does not require the resist printing step used for removing an n type layer formed on the back face and surface of a substrate of a conventional solar cell, an etching step, and a resist removal step. Therefore, a solar cell can be provided at low cost with a simple process.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 9(A) through (C) show sectional views of the manufacturing steps of a solar cell according to another embodiment of the present invention;

FIG. 30 is a graph showing the relationship between an increase in temperature and the shadowed area of one shadowed solar cell in a solar cell module;

DESCRIPTION OF THE PREFERRED EMBODIMENTS

Figure 1:
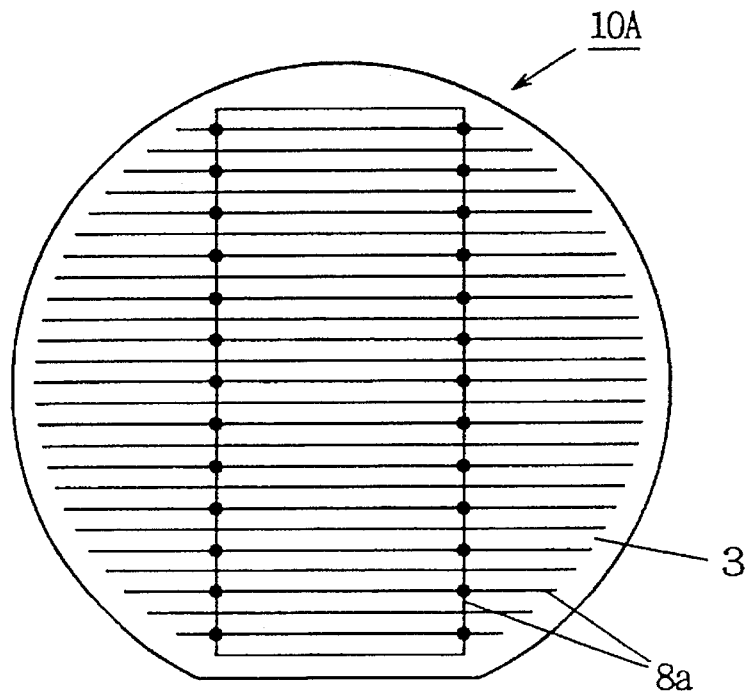
FIG. 1 is a top view of a solar cell according to an embodiment of the present invention.
Figure 2:
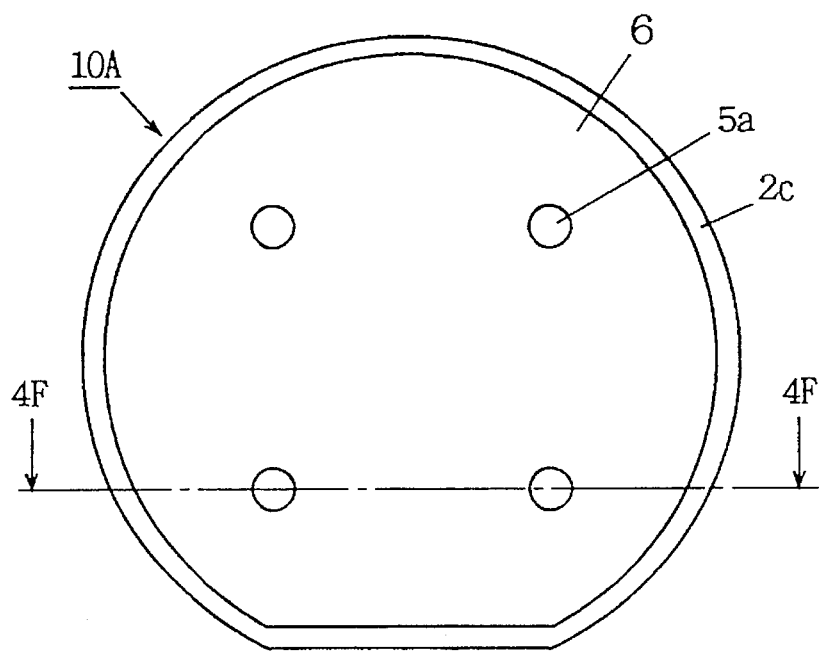
FIG. 2 is a back surface view of the solar cell of FIG. 1.
Figure 19:
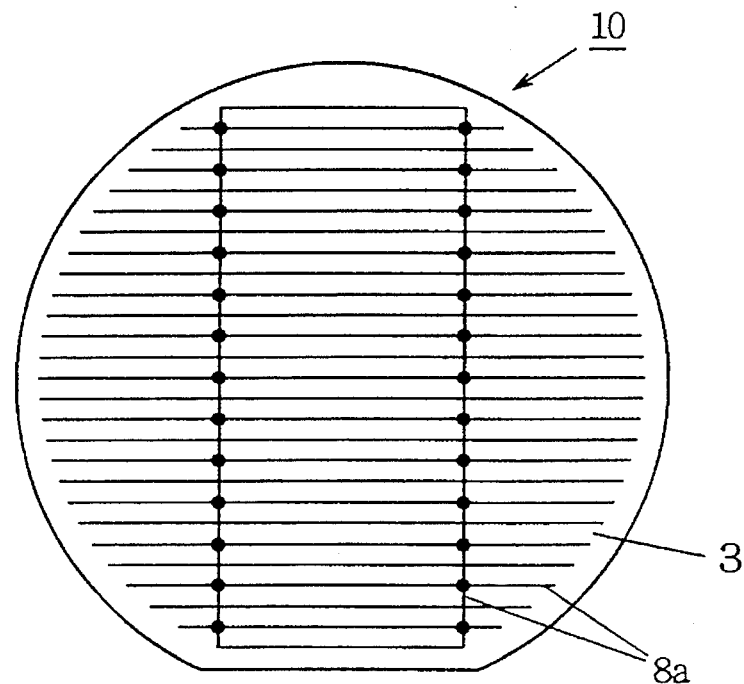
FIG. 19 is a top view of a conventional solar cell.
Figure 20:
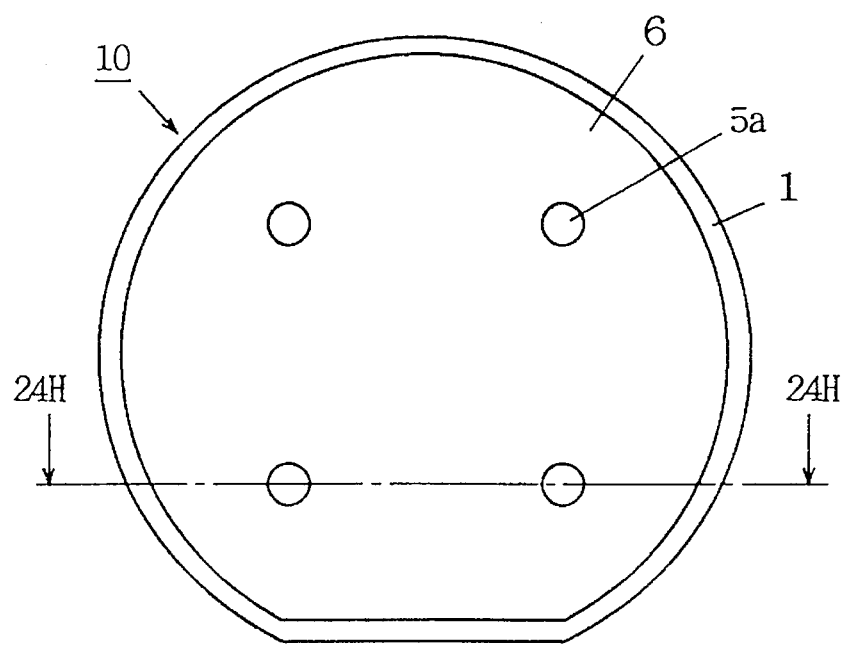
FIG. 20 is a bottom view of the solar cell of FIG. 19.

FIGS. 1 and 2 show a top view and a back surface view of a solar cell according to an embodiment of the present invention. The light receiving surface of a solar cell 10A of FIG. 1 has a structure identical to that of solar cell 10 of FIG. 19. Solar cell 10A of FIG. 2 differs from solar cell 10 of FIG. 20 in that an n type semiconductor layer 2c is formed at the peripheral edge portion of the back surface.

Figure 3A:
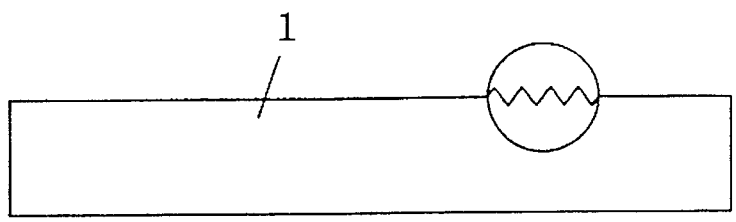
FIGS. 3(A) through (C) show sectional views of the manufacturing steps of the solar cell of FIGS. 1 and 2.
Figure 21A:
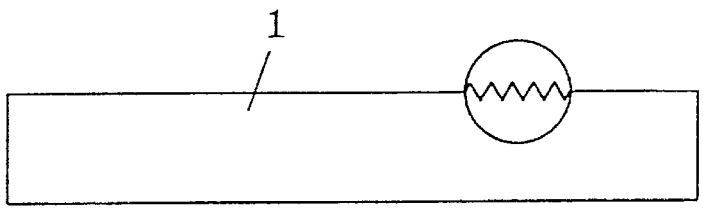
FIGS. 21(A) through (D) show sectional views of the manufacturing step of the solar cell of FIGS. 19 and 20.
Figure 21B:
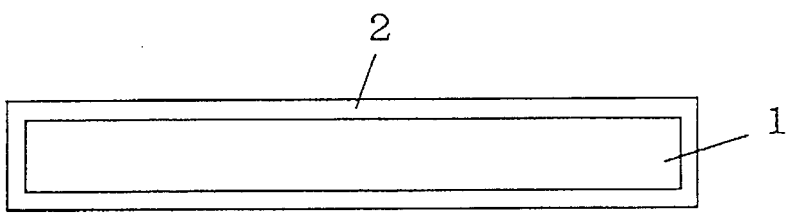

FIGS. 3 and 4 show the manufacturing steps of the solar cell shown in FIGS. 1 and 2. The step of FIGS. 3(A) is identical to that shown in FIG. 21(A), so that its description will not be repeated.

Figure 3B:
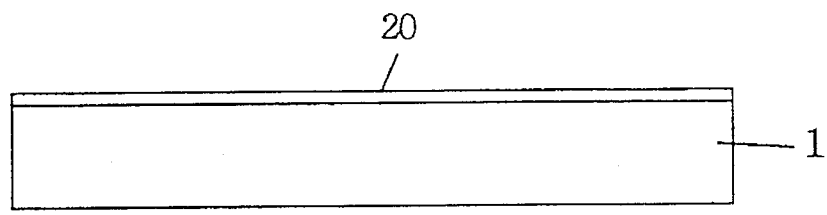

Referring to FIG. 3(B), a doping agent layer 20 is applied on the top face of a semiconductor substrate 1 by a spin coater. A solution including, for example, 80 ml of tetra isopropyl titanate, 2000 ml of isopropyl alcohol, and 45 g of phosphorus pentoxide may be used as this doping agent. The amount of phosphorus pentoxide is selected within the range of 20 g to 70 g depending upon the diffusion conditions in order to form an n layer of a desired impurity concentration (normally, $10^{19}$ to $10^{20}$ $cm^{-3}$) at the top face of substrate 1.

Figure 5:
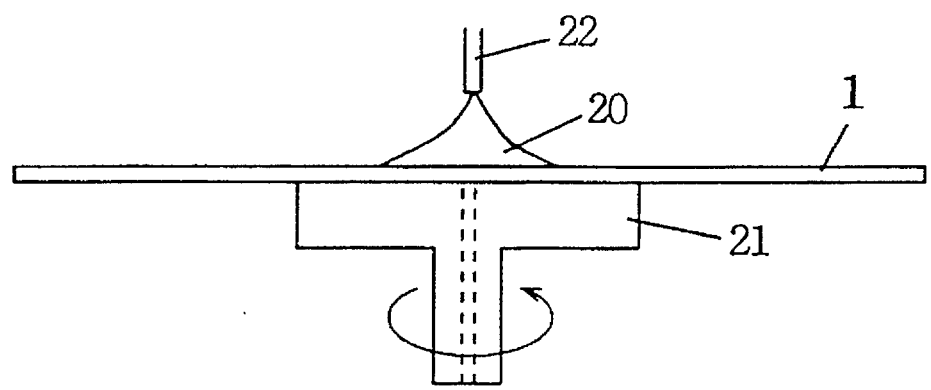
FIGS. 5 and 6 are elevation views showing examples of a spin coating method.

Such a doping agent 20 can be applied on semiconductor substrate 1 by a spin coating method shown in FIG. 5. The semiconductor substrate 1 is attracted via a tube along the rotary shaft of a spin chuck 21. The substrate 1 held by the spin chuck 21 is rotated at approximately 5000 rpm, and dopant solution 20 is applied dropwise onto substrate 1 via a nozzle 22. Dopant solution 20 dropped on substrate 1 spreads all over the top surface of the semiconductor substrate 1 by centrifugal force.

Figure 7:
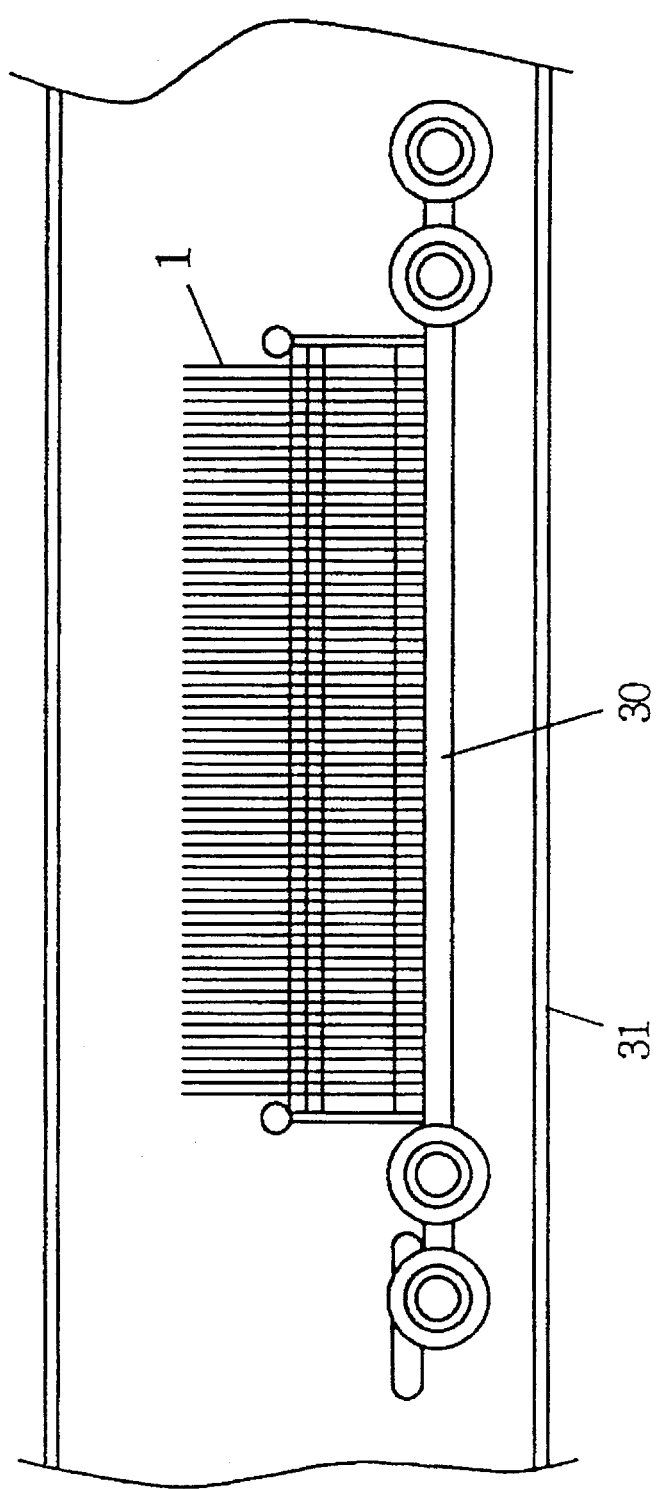
FIG. 7 is a sectional view of a plurality of silicon substrates arranged on a quartz board.

A plurality of the semiconductor substrates of FIG. 3(B) having doping agent 20 applied thereto are set on a quartz plate 30 shown in FIG. 7. Here, the plurality of semiconductor substrates 1 are set so that the main surfaces on which the doping agent is applied face the same direction. The distance between each substrate 1 is adjusted to be within the range of 2.0 mm to 5.0 mm. The quartz plate 30 is inserted into a quartz tube 31. In the quartz tube 31, $N_2$ gas including 0.5% to 10% of $O_2$ gas is provided. Preferably, the concentration range of $O_2$ gas is 1% to 5%. Under this condition, the plurality of semiconductor substrates 1 are subjected to a thermal treatment for 45 minutes at 900° C., for example.

Figure 3C:
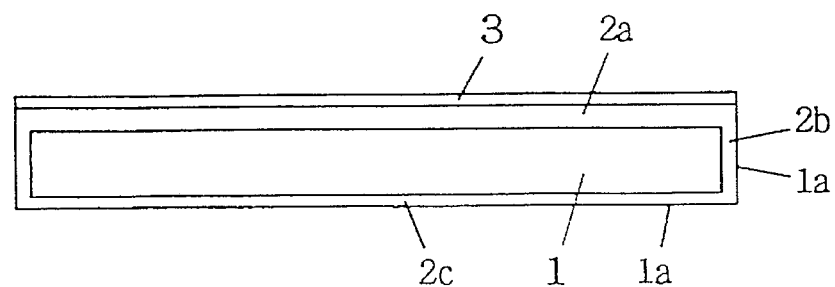

FIG. 3(C) shows the results of the thermal treatment shown in FIG. 7. On the top surface of the semiconductor substrate 1, an $n^+$ layer 2a of a thickness of approximately 0.4 µm and an anti-reflection film 3 of $TiO_2$ having a thickness of approximately 70–80 nm are formed simultaneously. Here, n type layers 2b and 2c are formed at the edge face and the bottom surface, respectively, of the substrate 1 due to auto doping resulting from out-diffusion from doping agent 20. The n layers 2b and 2c formed by auto doping have an impurity concentration lower than that of the $n^+$ layer 2a formed by direct diffusion from doping agent 20. Furthermore, a thin oxide film 1a of 20Å–100Å (the thickness of this oxide film is not shown in the drawing) is formed at the surfaces of n layers 2b and 2c. This oxide film can be used as a passivation film.

Figure 4A:
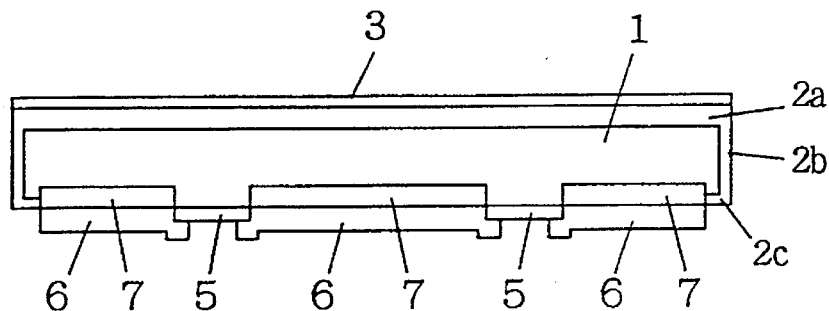
FIGS. 4(A) through (C) show sectional views subsequent to the manufacturing step of FIG. 3.

Referring to FIG. 4(A), paste 5 including silver and paste 6 including aluminum are printed in a predetermined pattern on the back surface of the substrate 1. The peripheral edge of paste layer 6 including aluminum is set in 1 mm–4 mm from the peripheral edge of the substrate 1. After the printed paste is dried, a baking process at a temperature of 700° C.–750° C. is carried out, whereby a back aluminum electrode 6 of approximately 50 µm in thickness and a back silver electrode 5 of approximately 20 µm in thickness are formed. Here, a $p^+$ layer 7 of approximately 5 µm in thickness is formed beneath the aluminum electrode 6. This $p^+$ layer 7 serves to generate the BSF effect of a solar cell.

Figure 4B:
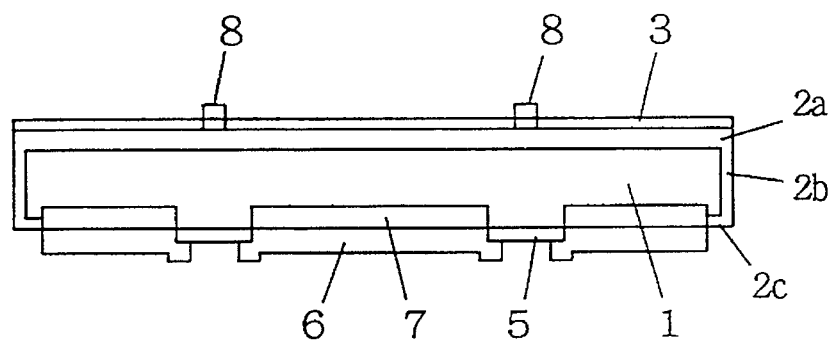

Referring to FIG. 4(B), a paste 8 including silver is printed with a pattern identical to that of pattern 8a of FIG. 1. The peripheral edge of the paste pattern 8 is set in by 1 mm–3 mm from the peripheral edge of substrate 1. The paste pattern 8 is baked at a temperature of 650° C.–750° C., whereby a front silver electrode 8 is formed Here, the paste including silver also includes glass frit, so that the silver electrode 8 forms an ohmic contact with $n^+$ layer 2a through the anti-reflection film 3.

Figure 4C:
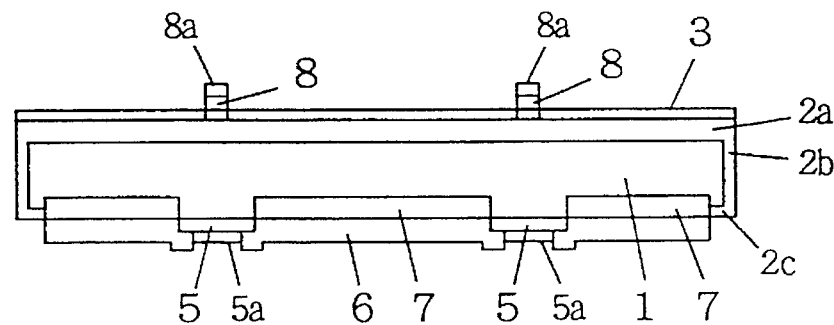

Referring to FIG. 4(C), the semiconductor substrate 1 is dipped in a solder tank at approximately 190° C., whereby silver electrodes 5 and 8 are covered with solder layers 5a and 8a, respectively, of approximately 20 µm in thickness. Thus, the solar cell shown in FIGS. 1 and 2 is completed. The sectional view of FIG. 4(C) corresponds to the structure of FIG. 2 taken along line 4F—4F.

Figure 8:
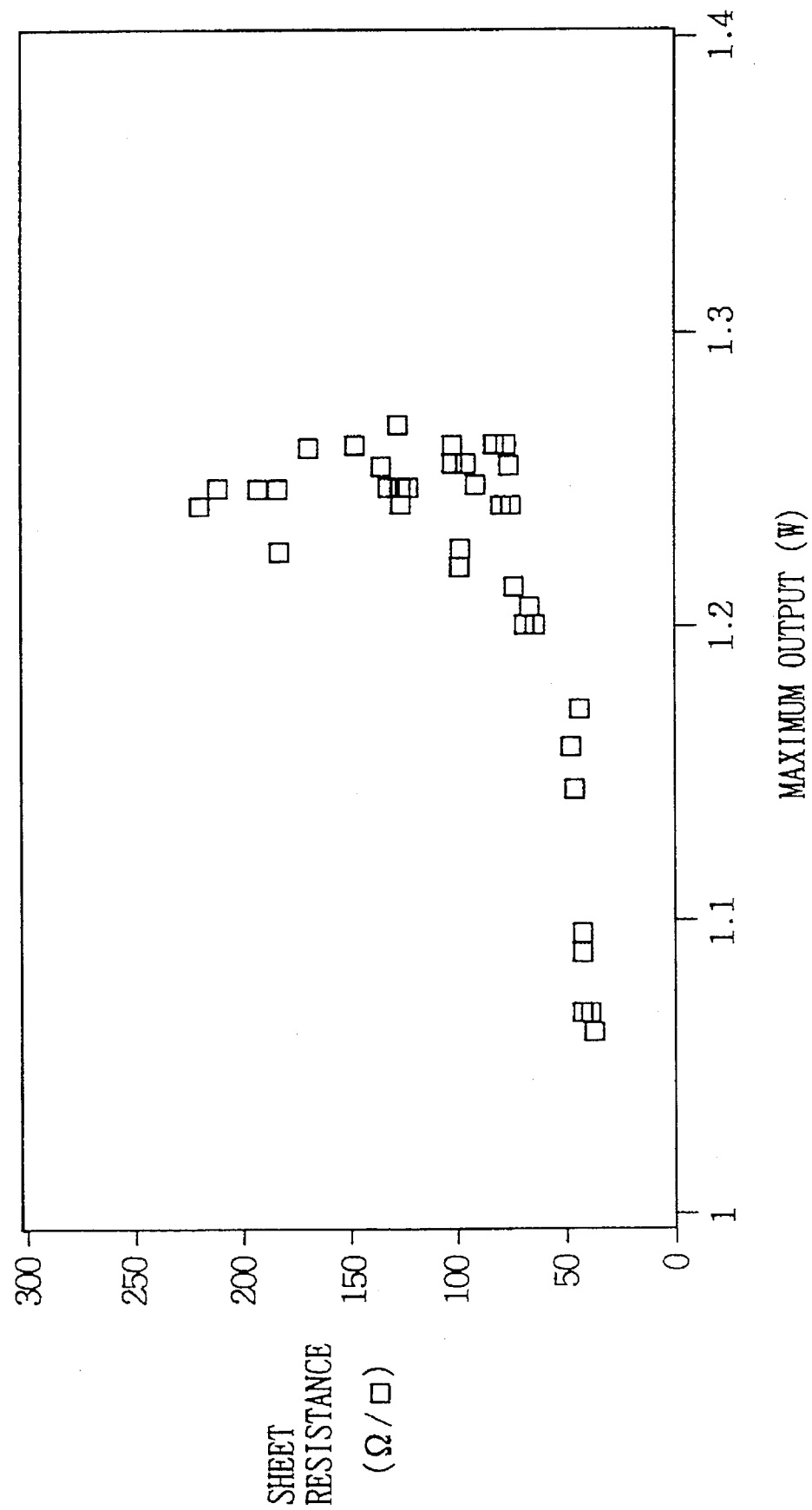
FIG. 8 is a graph showing the relationship between the maximum output and the sheet resistance of an n layer 2c of the solar cell shown in FIG. 2.

FIG. 8 is a graph showing the relationship between the maximum output and the sheet resistance of the back face n layer 2c in the solar cell of FIG. 4(C). The maximum output (W) of the solar cell is plotted along the abscissa, and the sheet resistance ($\Omega/\square$) of n layer 2c on the back surface is plotted along the ordinate. It is appreciated from FIG. 8 that the solar cell exhibits high and stable maximum output when the sheet resistance of the n layer 2c becomes greater than 70$\Omega/\square$. However, if the sheet resistance of the n layer 2c is too great, the solar cell will have great parallel resistance, so that the object of the present invention cannot be achieved. Therefore, the sheet resistance of the n layer 2c is preferably within the range of 70–300$\Omega/\square$. More preferably, the sheet resistance of the n layer 2c is within the range of 70–200$\Omega/\square$ in order to further facilitate the current flow when a reverse bias voltage is applied to the solar cell.

The sheet resistance of the n layer 2c at the back surface of substrate 1 can be controlled by adjusting the diffusion conditions such as the oxygen partial pressure and the distance between the substrates during the diffusion step shown in FIGS. 3(C) and 7.

Figure 21C:
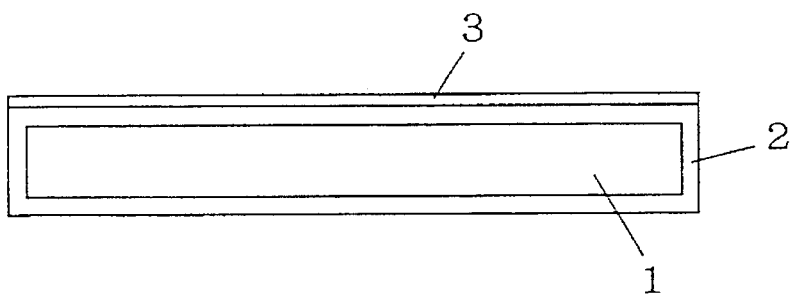
Figure 21D:
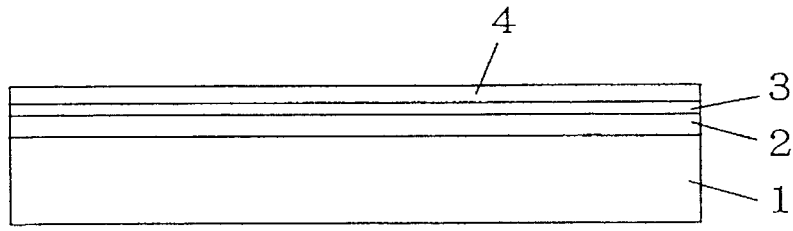
Figure 22A:
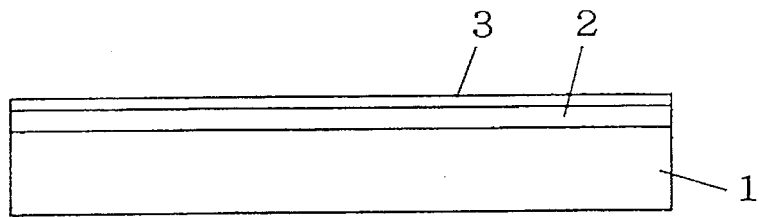
FIGS. 22(A) through (D) show sectional views of the manufacturing process subsequent to FIG. 21.
Figure 22B:
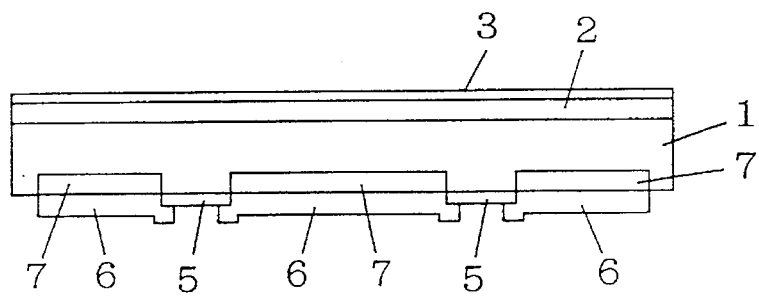
Figure 22C:
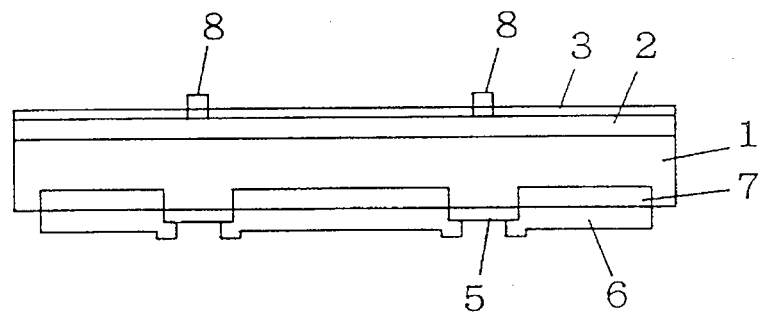
Figure 22D:
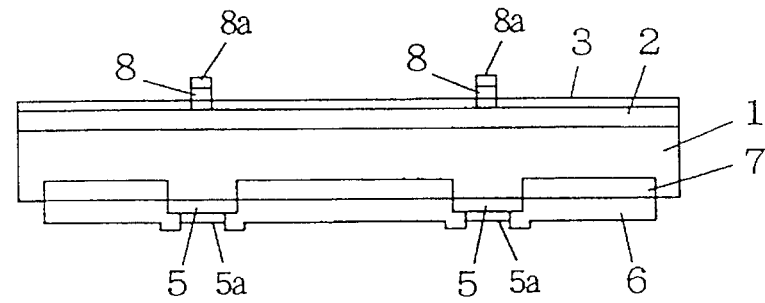
Figure 23A:
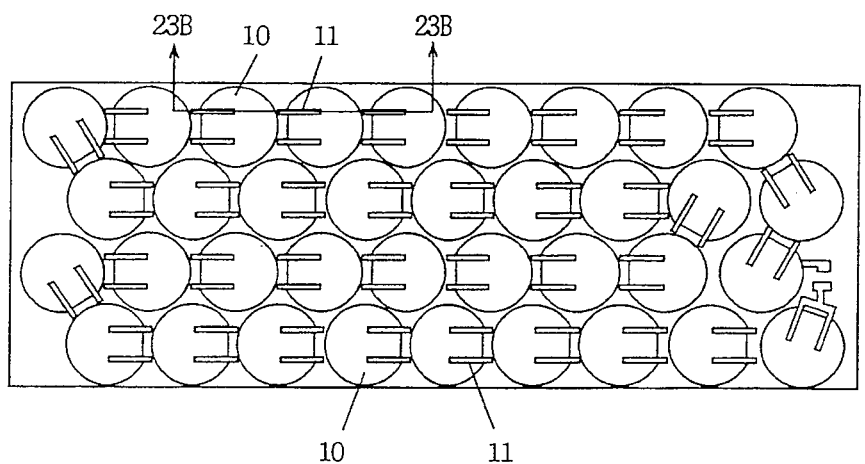
FIGS. 23(A) through (C) show a solar cell module having thirty six solar cells connected.
Figure 23B:
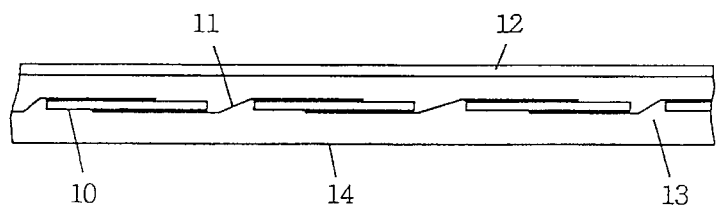
Figure 23C:
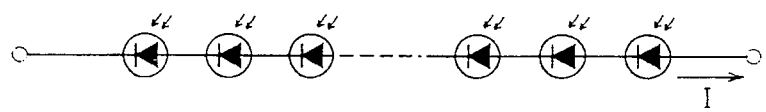
Figure 24:
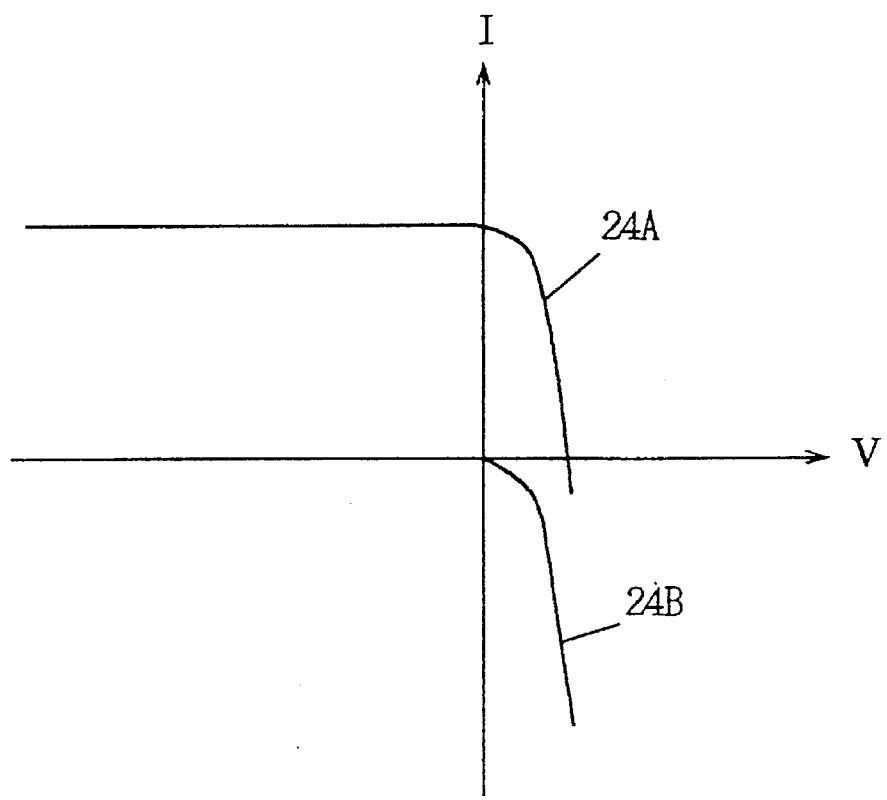
FIG. 24 is a graph showing the I-V characteristics in a solar cell having great parallel resistance.

In contrast to the manufacturing steps shown in FIGS. 21 and 22, it is appreciated that the embodiment shown in FIGS. 3 and 4 does not require the anti-reflection film formation steps shown in FIG. 21(C) since the anti-reflection film 3 is formed at the same time the n type layers 2a, 2b, and 2c are formed as shown in FIG. 3(C), and also the resist printing step and etching step shown in FIG. 21(D), and the resist removal step shown in FIG. (E). More specifically, the manufacturing steps of the embodiment shown in FIGS. 3 and 4 are extremely simplified in comparison with the steps of the prior art shown in FIGS. 23 and 24. Therefore, a solar cell can be manufactured at a low cost.

Figure 10A:
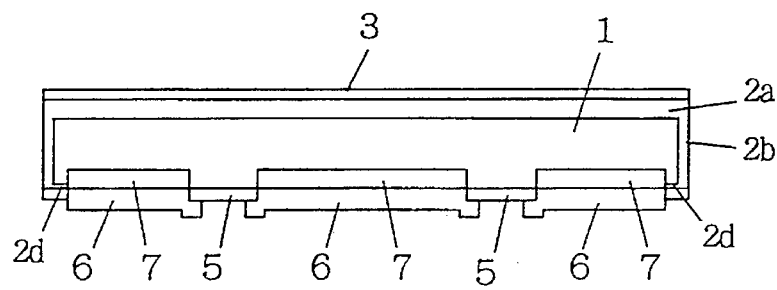
FIGS. 10(A) through (C) show sectional views of the manufacturing steps subsequent to FIG. 9.
Figure 10B:
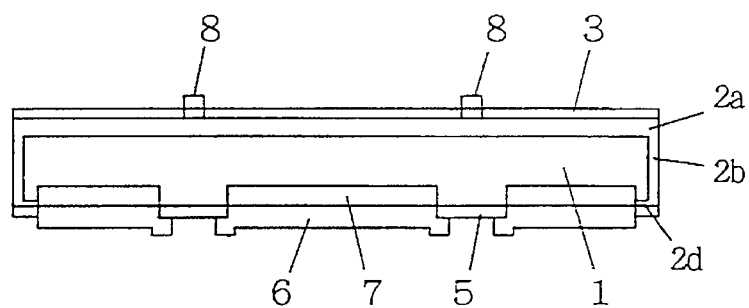
Figure 10C:
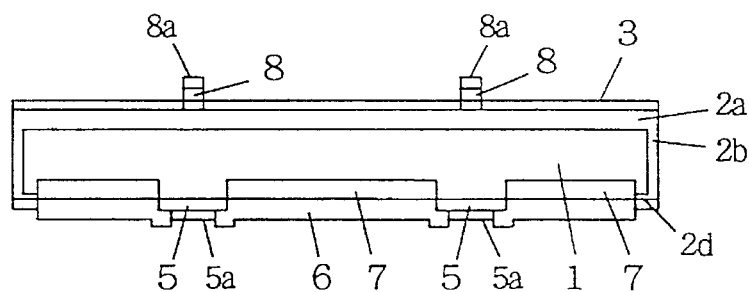

FIGS. 9 and 10 show the manufacturing steps of a solar cell according to another embodiment of the present invention.

Referring to FIG. 9(A), a p type silicon substrate 1 similar to that of FIG. 3(A) is prepared.

Figure 6:
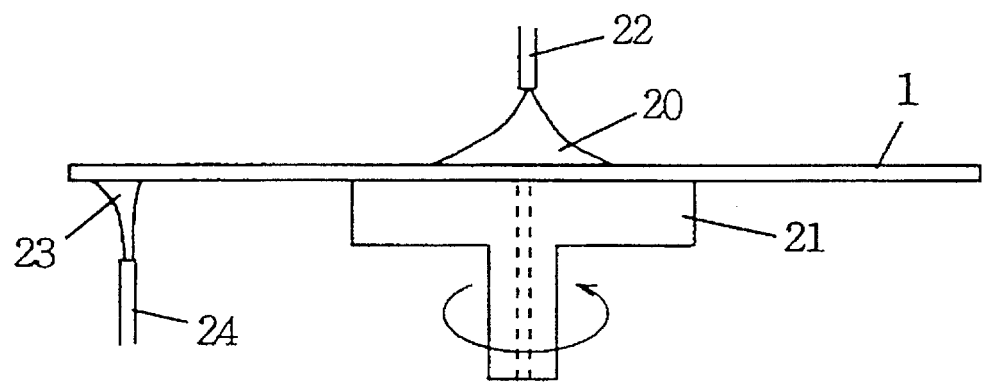

Referring to FIG. 9(B), a doping agent layer 20 is applied on the top face of substrate 1, and a partial mask layer is applied at the peripheral edge portion of the bottom surface. Doping agent 20 can be applied, as shown in FIG. 6, using a spin coater as in the step of FIG. 3(B). It is to be noted that in FIG. 9(B), mask material 23 is applied from a nozzle 24 (see FIG. 6) to the peripheral edge portion of the back surface of substrate 1.

A solution including 100 ml of ethyl silicate, 50 ml of acetic acid, and 500 ml of ethyl alcohol, for example, can be used as the mask material 23. The mask material 23 may include 1 g–10 g of phosphorus pentoxide in order to prevent the mask layer 23 from functioning as a complete mask and to ensure slight diffusion of n type dopants. The mask material 23 may include an alkyl titanate instead of an alkyl silicate such as ethyl silicate.

Referring to FIG. 9(C), substrate 1 having doping agent layer 20 and mask layer 23 applied is subjected to a thermal treatment for 45 minutes at 900° C., for example. As a result, an n type layer 2a of a high impurity concentration and anti-reflection film 3 are formed on the substrate 1. n type layers 2b and 2c having an impurity concentration lower than that of n type layer 2a are formed at the edge face and the bottom surface, respectively, of substrate 1. An n type layer 2d having a thickness and impurity concentration smaller than those of the bottom face n type layer 2c is formed beneath the mask layer 23.

The manufacturing steps shown in (A) to (C) of FIG. 10 are similar to those of FIG. 4, and their description will not be repeated.

The manufacturing method of a solar cell shown in FIGS. 9 and 10 can be applied to a vapor diffusion method using $POCl_3$ gas. In this case, the application of the doping agent layer 20 on substrate 1 is omitted, and vapor diffusion is carried out using $POCl_3$ gas after the mask layer 23 is provided.

Although in the embodiment of FIGS. 9 and 10 as described the mask layer 23 is not removed, the mask layer 23 may be removed using a weak hydrofluoric acid. Mask 23 solution can be obtained by mixing a main solution described below and a solution including titanium or silicon. An additional solution may further be mixed if desired.

As the main solution, an alcohol group such as isopropyl alcohol, ethyl alcohol, methyl alcohol, and butyl alcohol or a ketone group such as methyl ethyl ketone can be used.

As a solution including titanium, tetra isopropyl titanate, tetra n-butyl titanate, titanium chloride, etc. can be used. Furthermore, a solution having a powder such as titanium, titanium boride, titanium carbide, and titanium dioxide mixed into acid, alkali, alcohol, ester, etc. can be used.

Ethyl silicate, methyl silicate, and isopropyl silicate can be used for the solution including silicon. Furthermore, a solution including a halide of silicon can be used.

As the additional solution, carboxylic acid such as formic acid, acetic acid, oxalic acid, benzoic acid, etc. can be used.

As doping agent 20, a mixture of the above-described main solution and a solution including titanium added with an appropriate amount of a phosphorus source such as phosphorus pentoxide or phosphorus oxychloride can be used. For example, phosphorus of 1.04–3.63 gram atoms is added per 1 mol of $TiO_2$ in a solution including titanium, and the alcohol group as the main solution has the mixing amount determined according to the number of revolutions of the spin coater to obtain the doping agent layer 20 of a desired thickness (for example 70–80 nm). A more preferable mixing amount of phosphorus is 2.2–2.5 gram atom per 1 mol of $TiO_2$. This value is selected since front silver electrode 8 cannot easily pierce the anti-reflection film 3 if the phosphorus concentration is too low, and control of the impurity concentration of the n layer formed at the edge face and the back surface of the substrate will become difficult due to significant out-diffusion if the phosphorus concentration is too high. More specifically, a preferred example of a dopant solution is a mixture of 80 ml tetra isopropyl titanate (corresponding to 28% $TiO_2$), 2000 ml of isopropyl alcohol, and 45 g of phosphorus pentoxide.

Figure 11:
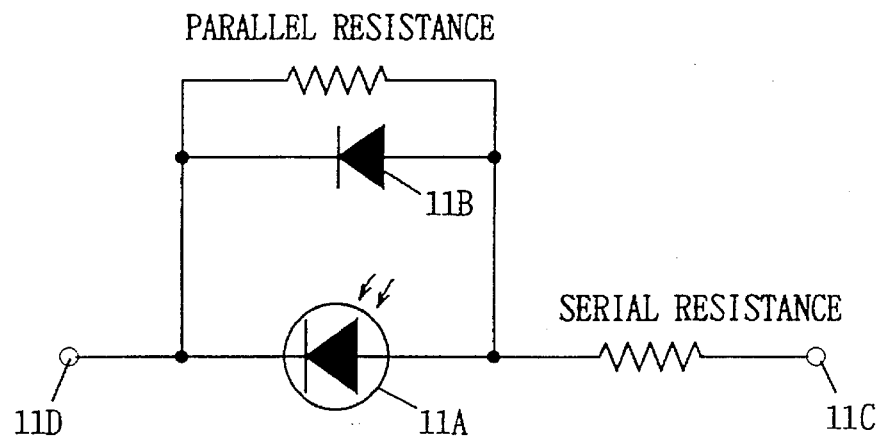
FIG. 11 is an equivalent circuit diagram of a solar cell according to the present invention.

FIG. 11 shows an equivalent circuit diagram of a solar cell according to the present invention. Solar cell 11A includes a parallel diode 11B in addition to parallel resistance and serial resistance. Solar cell 11A is formed of a p type substrate 1 and an $n^+$ layer 2a. The parallel diode 11B is formed of a $p^+$ layer 7 and an n layer 2c in the embodiment of FIG. 4(C), and a $p^+$ layer 7 and an n layer 2d in the embodiment of FIG. 10(C). In such a solar cell, parallel diode 11B serves as a solar cell when illuminated with light. However, when the solar cell is shadowed and a reverse bias voltage is applied across nodes 11C and 11D, a relatively large leakage current can be conducted from node 11D to node 11C since the parallel diode 11B has inferior reverse direction properties. More specifically, the solar cell shown in FIG. 11 is equivalent to including an extremely low parallel resistance when shadowed.

Figure 12:
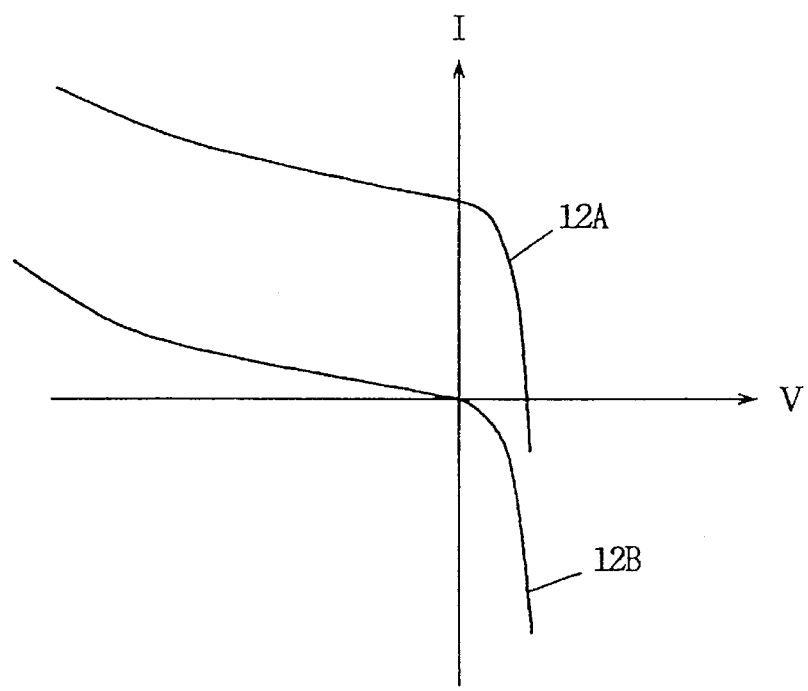
FIG. 12 is a graph showing the I-V characteristics of the solar cell of FIG. 11.
Figure 25:
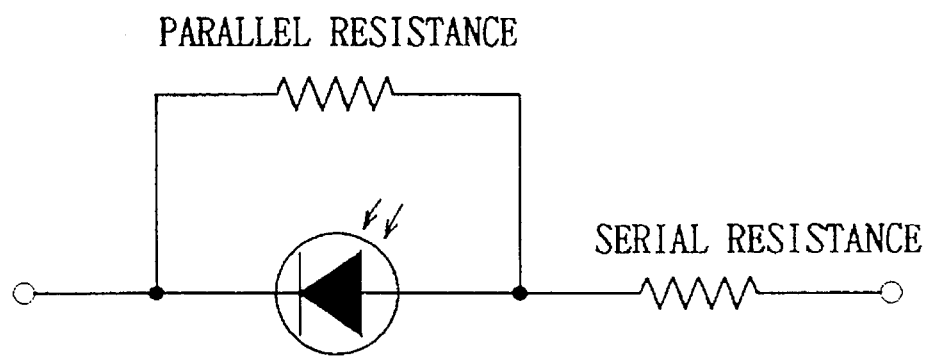
FIG. 25 is an equivalent circuit diagram of a conventional solar cell.

FIG. 12 shows the I-V characteristics in a qualitative manner of the solar cell of FIG. 11. Curves 12A and 12B show the I-V characteristics of a solar cell when not shadowed and when completely shadowed, respectively. By comparing curve 12B with curve 24B of FIG. 24, it is appreciated that the solar cell of FIG. 11 can conduct a greater current flow when a reverse bias voltage is applied in comparison with the solar cell of FIG. 25.

Figure 13:
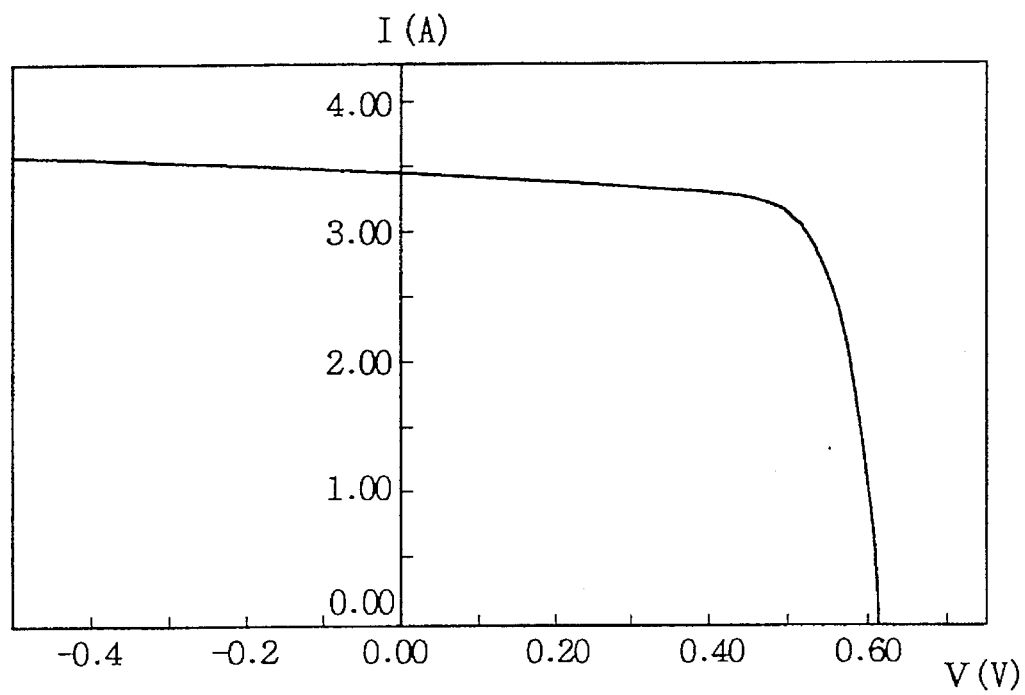
FIG. 13 is a graph showing the I-V characteristics actually measured of a solar cell obtained according to the present invention.

FIG. 13 shows an example of the measured I-V characteristics of a solar cell obtained according to the present invention. It is appreciated that the solar cell of the present invention having an extremely low parallel resistance has photoelectric conversion efficiency identical to that of a solar cell having a very high parallel resistance.

Figure 14:
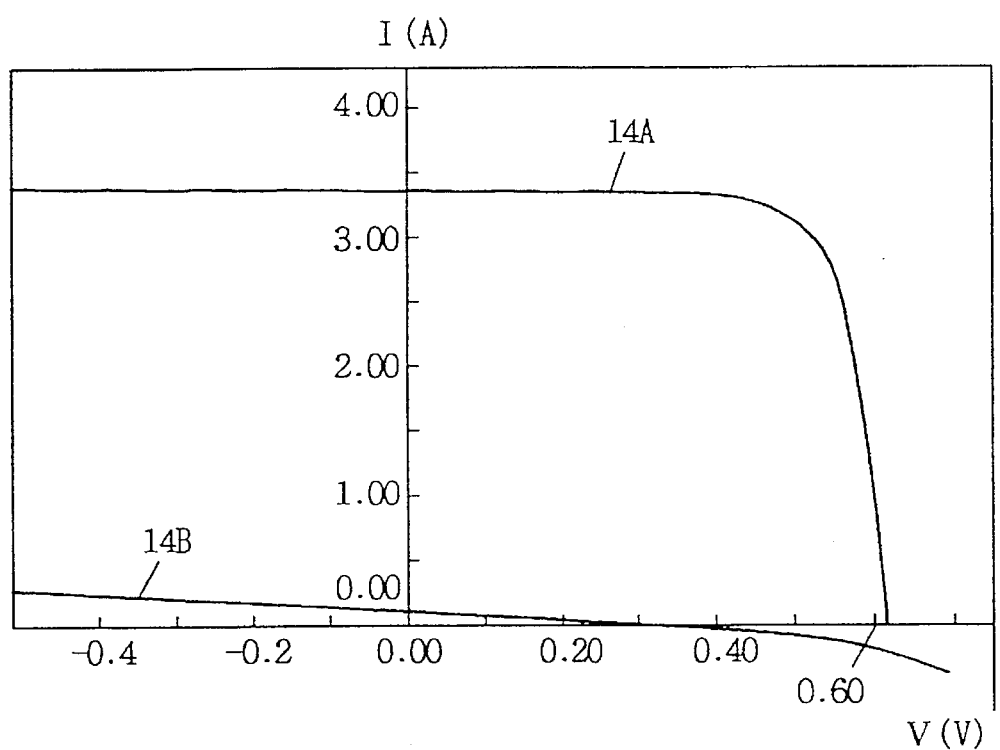
FIG. 14 is a graph showing the I-V characteristics of FIG. 13 divided into the I-V characteristics of the main components of the solar cell and the I-V characteristics of a parallel diode.

FIG. 14 is a graph showing two I-V characteristics obtained by dividing the curve shown in FIG. 13 into two components. More specifically, curve 14A shows the I-V characteristics of solar cell 11A of FIG. 11, and curve 14B shows the I-V characteristics of parallel diode 11B. It can be considered that the I-V characteristics of FIG. 13 are obtained as a result of combining the I-V characteristics of solar cell 11A of FIG. 11 and the I-V characteristics of parallel diode 11B.

Figure 15:
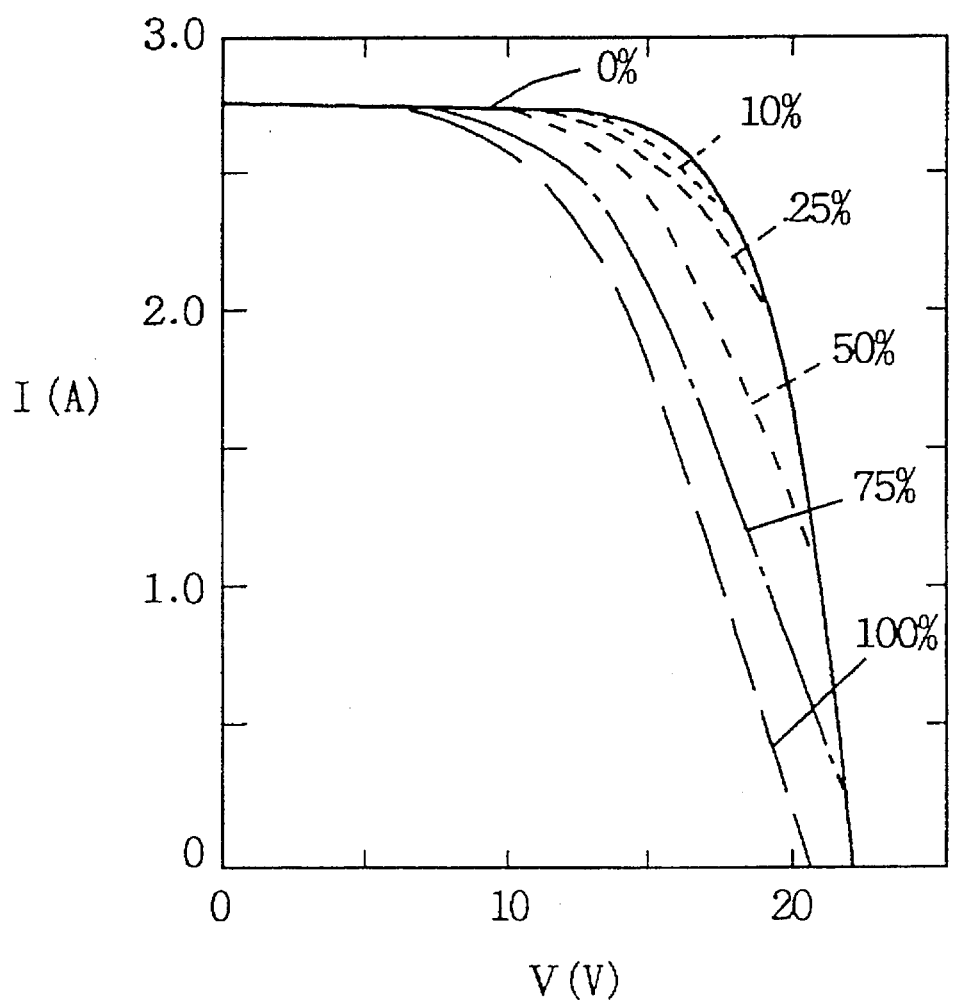
FIG. 15 is a graph showing the I-V characteristics in a solar cell module having thirty six solar cells of the present invention connected in series.
Figure 26:
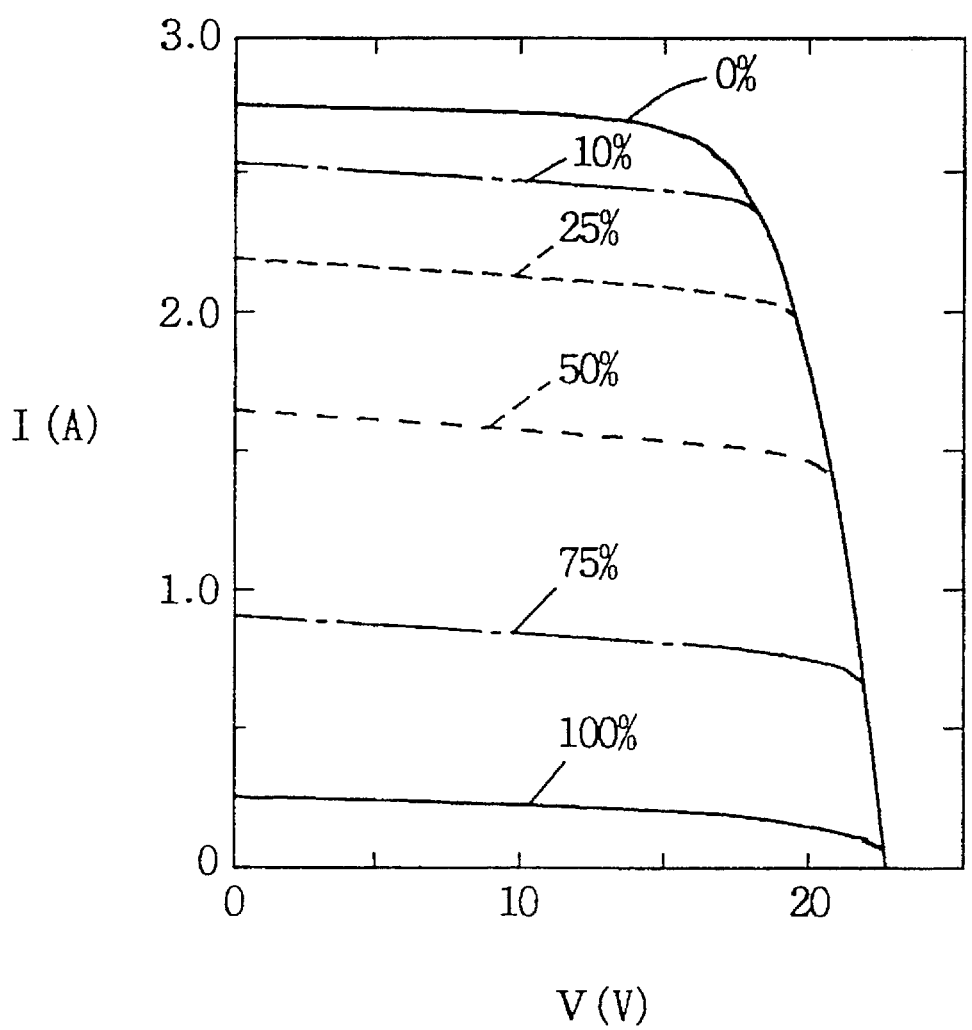
FIG. 26 is a graph showing the I-V characteristics in a solar cell module formed by conventional solar cells.
Figure 27A:
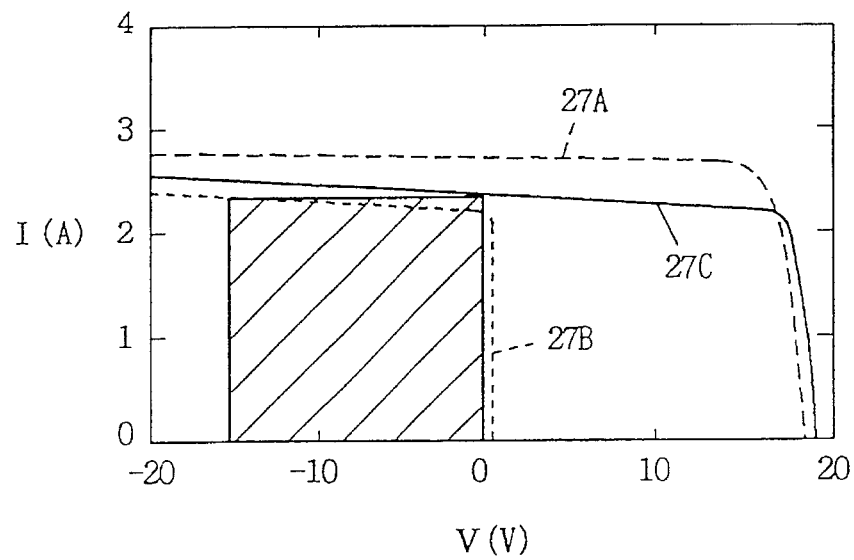
FIGS. 27(A) and (B) and FIGS. 28(A) and (B) are graphs showing the power consumption of one shadowed solar cell in a solar cell module formed by solar cells having great parallel resistance and low parallel resistance, respectively.
Figure 27B:
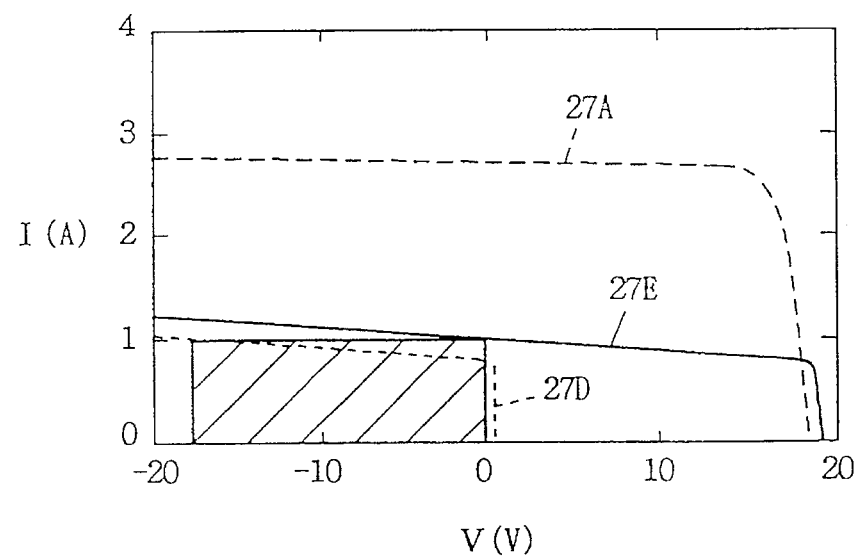
Figure 28A:
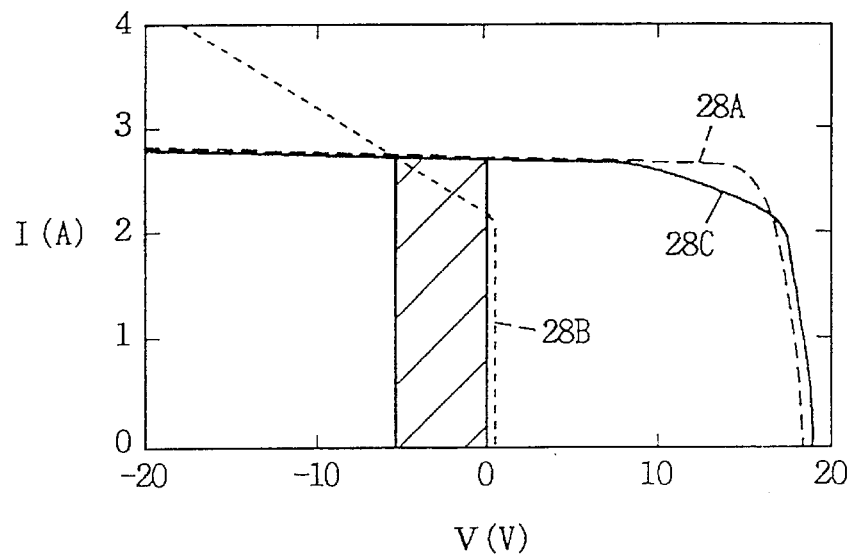
Figure 28B:
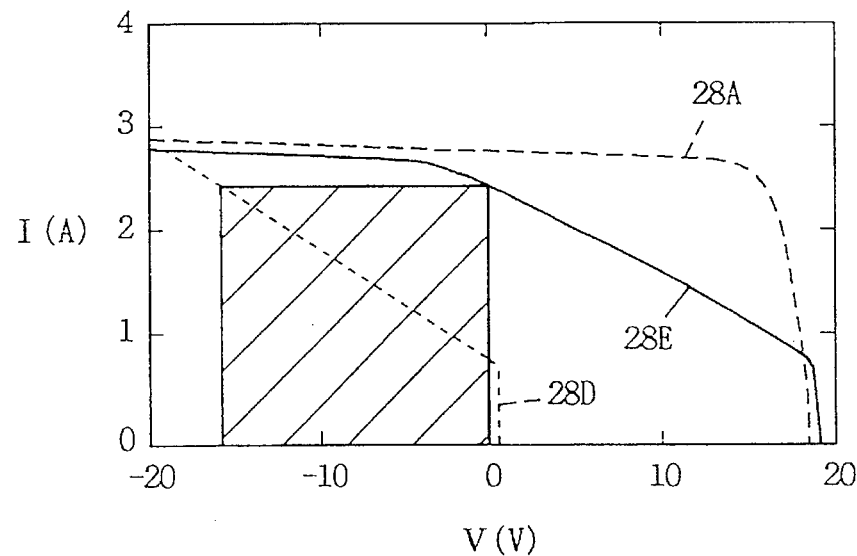
Figure 29:
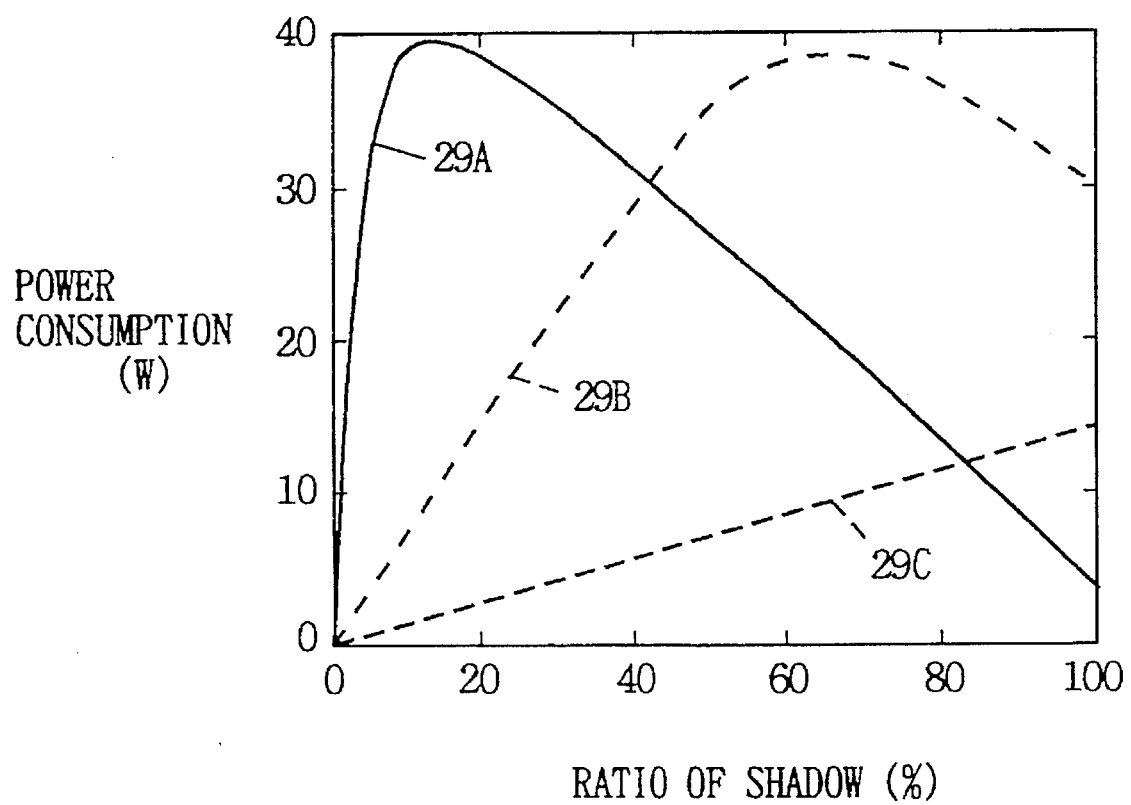
FIG. 29 shows the relationship between power consumption and the ratio of the shadowed area in a shadowed solar cell module.
Figure 31A:
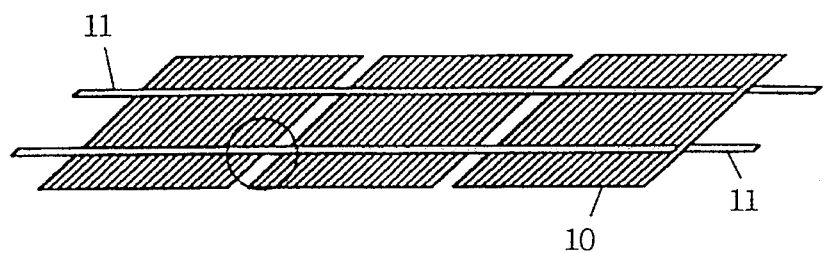
FIGS. 31(A) through (C) show a conventional solar cell module including a bypass diode.
Figure 31B:
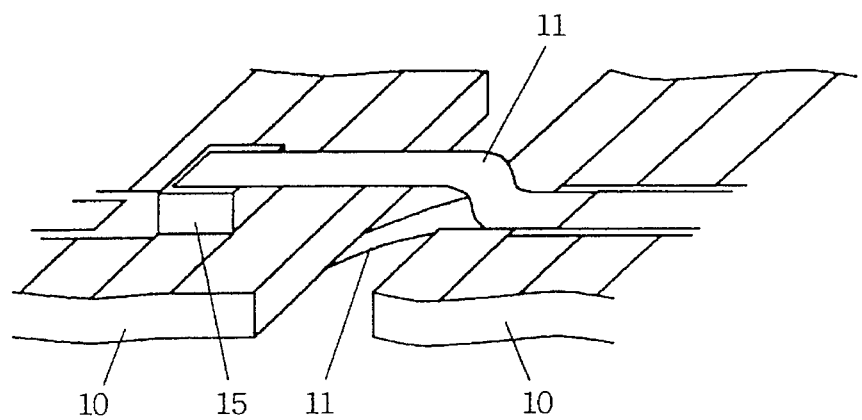
Figure 31C:
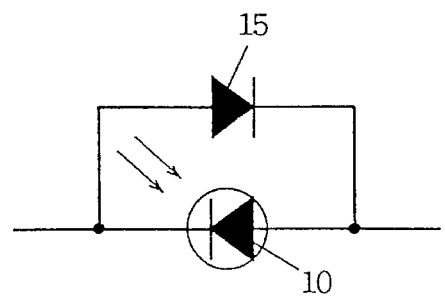

FIG. 15 shows the I-V characteristics when one solar cell is shadowed in a solar cell module including thirty six solar cells of the present invention. The present solar cell has a parallel resistance of approximately $100\Omega/cm^2$, including the parallel diode. The value of the % shown in the graph represents the ratio of a shadowed area with respect to the light receiving surface of one solar cell. It is appreciated from the graph of FIG. 15 that the output of the solar cell module is only by approximately 30% even when one solar cell is completely shadowed. By comparing FIGS. 15 and 26, it is appreciated that a solar cell module using the solar cells of the present invention has an extremely reduced output reduction when shadowed in comparison with that of a conventional solar cell module.

Figure 16A:
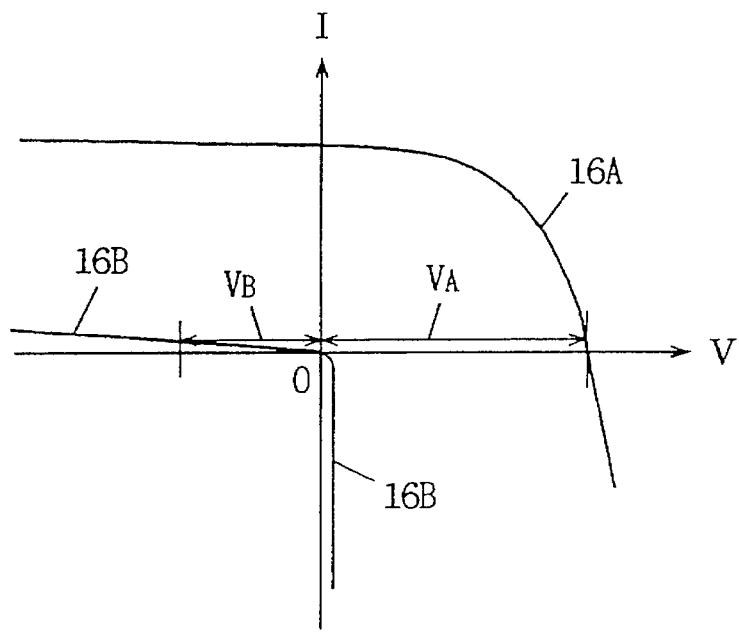
FIGS. 16(A) and (B) and FIGS. 17(A) and (B) are graphs for describing the I-V characteristics in a solar cell module formed by solar cells having great parallel resistance and low parallel resistance, respectively.
Figure 16B:
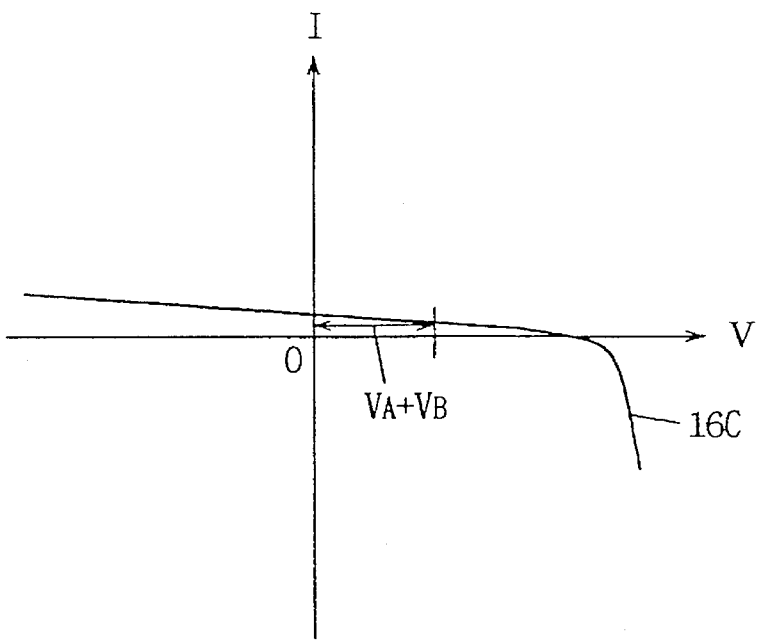

This can be understood more easily by comparing FIGS. 16 and 17. FIG. 16 shows the I-V characteristics of a solar cell module using solar cells having high parallel resistance. In FIG. 16(A), curve 16B shows the I-V characteristics of one solar cell completely shadowed. Curve 16A shows the I-V characteristics of n solar cells connected in series. $V_A$ represents the voltage of curve 16A, and $V_B$ represents the voltage of curve 16B. In FIG. 16(B), curve 16C shows the I-V characteristic which is a combination of curves 16A and 16B. It can be appreciated that the output current of (n+1) solar cells connected in series is significantly reduced since the shadowed solar cell has a great parallel resistance.

Figure 17A:
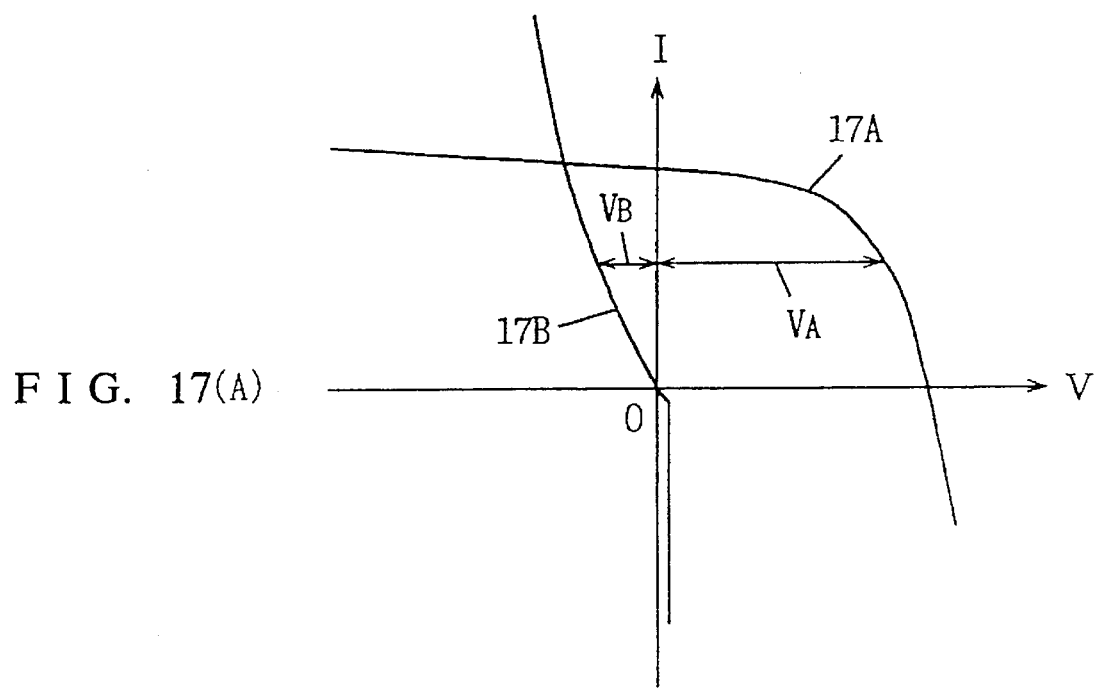
Figure 17B:
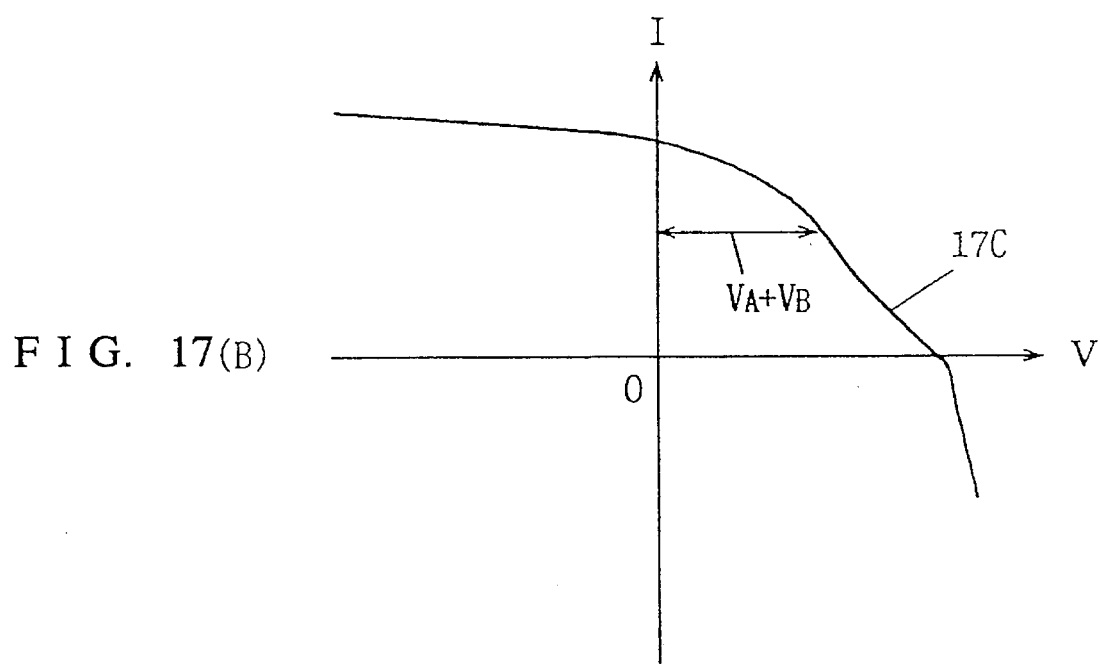

FIG. 17 shows the I-V characteristics of a solar cell module using the solar cells of the present invention. In FIG. 17(A), curve 17A is similar to curve 16A in FIG. 16(A), showing the I-V characteristic of n solar cells connected in series. In contrast, curve 17B shows the I-V characteristic when one solar cell having an extremely low small parallel resistance ($100\Omega/cm^2$) is completely shadowed. More specifically, since this solar cell has a low parallel resistance, current resulting from a reverse bias voltage, when applied, can be easily conducted. In FIG. 17(B), curve 17C shows the I-V characteristics of a solar cell module including (n+1) solar cells connected in series obtained by combining curves 17A and 17B. By comparing FIGS. 17 (B) and 16 (B), it is seen that reduction in the output of the entire solar cell module is significantly reduced even if one solar cell is shadowed, when the solar cell has a low parallel resistance.

Curve 30B in FIG. 30 shows the relationship between the shadowed area of one solar cell and an increase in temperature within a solar cell module having thirty six solar cells of the present invention connected together. It is appreciated that, even when one solar cell is completely shadowed in a solar cell module including 36 solar cells of the present invention, the increase in temperature of that solar cell is only 11° C. in comparison with the other solar cells. This is because current due to reverse bias voltage flows easily since the parallel resistance of the shadowed solar cell is low.

Figure 18:
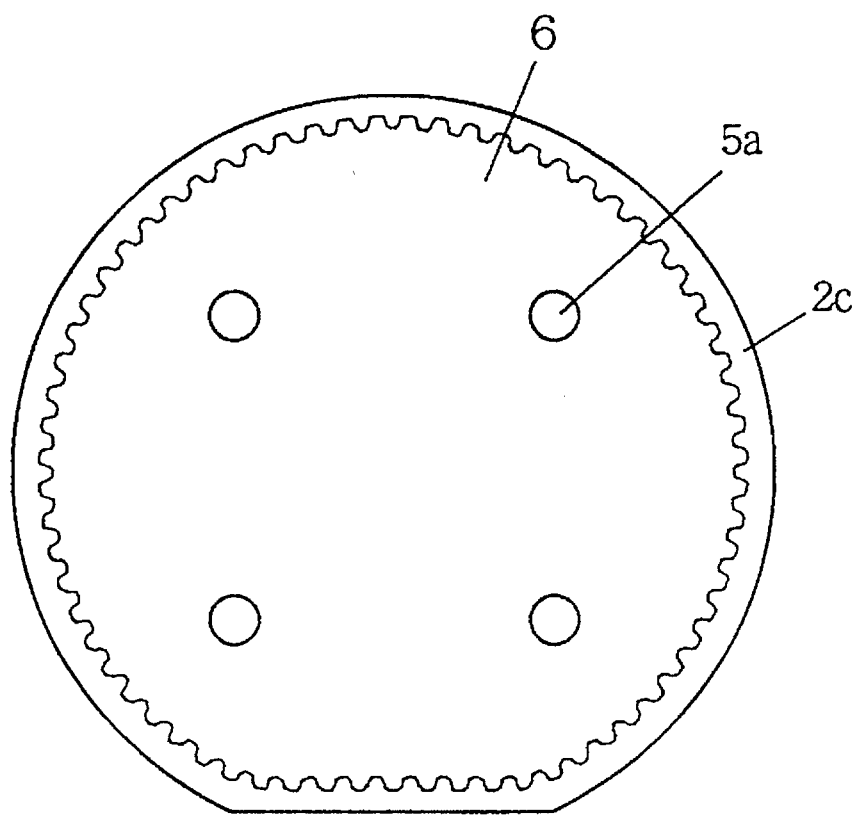
FIG. 18 is a bottom view of a solar cell according to a further embodiment of the present invention.

When the parallel resistance is to be further reduced in a solar cell of the present invention shown in FIG. 2, the peripheral edge of aluminum electrode pattern 6 can be formed in a waveform manner as shown in FIG. 18 to increase the contact interface between n layer 2c and $p^+$ layer 7 shown in FIG. 4 (C).

Paste 6 including aluminum may include silver paste including several % of aluminum.

According to the present invention, a solar cell can be provided that has a photoelectric conversion efficiency equal to that of a conventional solar cell, and that can have the adverse effect due to shadowing significantly reduced when the cell used in a solar cell module. More specifically, in a solar cell module using a solar cell of the present invention, reduction of output when local shadowing occurs can be significantly lowered. Also, excessive heating of a shadowed solar cell in a solar cell module can be prevented. Therefore, the disadvantage of short circuit breakdown of the solar cell and the possibility of fire can be avoided.

According to the present invention, a solar cell that can exhibit superior effects when used in a solar cell module can be provided with a simple process at low cost.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solar cell comprising:

a p type semiconductor substrate including a first main surface, a second main surface, and an edge face therebetween;

a first n type layer formed on said first main surface;

a p type layer formed on said second main surface and having a dopant impurity concentration higher than that of said substrate; and a second lower doped n type layer formed at least on said edge face so as to connect said first n type layer with said p type layer, wherein said second n type layer has a dopant impurity concentration lower than that of said first n type layer at least proximate the region in contact with said p type layer.

2. The solar cell according to claim 1, wherein said second n type layer has a sheet resistance within the range of 70 to $300\Omega/\square$ at least proximate said region in contact with said p type layer.

3. The solar cell according to claim 1, wherein said second n type layer extends to a peripheral edge of said second main surface as well as on said edge face.

4. The solar cell according to claim 1, wherein said second n type layer and said p type layer are connected on said second main surface, the connecting surface thereof being formed in a waveform manner in order to increase the connecting area.

5. A method of manufacturing a solar cell comprising the steps of:

preparing a p type semiconductor substrate including a first main surface, a second main surface, and an edge face therebetween;

applying an n type doping agent on said first main surface;

forming an $n^+$ type layer on said first main surface a lower doped n type layer on said edge face and said second main surface by applying a first thermal treatment to said substrate applied with said doping agent;

applying a paste layer including aluminum on said second main surface; and forming a $p^+$ type layer on said second main surface and forming an electrode by applying a second thermal treatment to said substrate applied with said paste layer including aluminum.

6. The manufacturing method of a solar cell according to claim 5, wherein a partial mask layer is applied at a peripheral edge of said second main surface when applying said n type doping agent on said first main layer, wherein said second n type layer formed by said first thermal treatment has a thickness and dopant impurity concentration reduced in a region below said mask layer.

7. The manufacturing method of a solar cell according to claim 5, wherein said doping agent comprises a solution including phosphorus in the range of 1.04–0.63 gram atoms per 1 mol of $TiO_2$, and wherein said $n^+$ type layer on said first main surface and an anti-reflection film of $TiO_2$ are simultaneously formed by said first thermal treatment.

8. The manufacturing method of a solar cell according to claim 5, wherein oxygen of a predetermined partial pressure is introduced during said first thermal treatment, whereby an oxide passivation film is formed at the surface of said substrate.

* * * * *